(12) United States Patent
Ishikawa et al.

(10) Patent No.: US 11,215,584 B2
(45) Date of Patent: Jan. 4, 2022

(54) MATERIAL DEFECT DETECTION DEVICE, MATERIAL DEFECT DETECTION SYSTEM, MATERIAL DEFECT DETECTION METHOD, AND NON-TRANSITORY COMPUTER READABLE STORAGE MEDIUM

(71) Applicant: Yokogawa Electric Corporation, Tokyo (JP)

(72) Inventors: Tetsuya Ishikawa, Tokyo (JP); Hideki Yoshida, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 82 days.

(21) Appl. No.: 16/344,990

(22) PCT Filed: Oct. 23, 2017

(86) PCT No.: PCT/JP2017/038149
§ 371 (c)(1),
(2) Date: Apr. 25, 2019

(87) PCT Pub. No.: WO2018/084011
PCT Pub. Date: May 11, 2018

(65) Prior Publication Data
US 2019/0271663 A1    Sep. 5, 2019

(30) Foreign Application Priority Data

Nov. 4, 2016 (JP) .............................. JP2016-216586
Jan. 5, 2017 (JP) .............................. JP2017-000421

(51) Int. Cl.
*G01N 27/82* (2006.01)
*G01R 33/00* (2006.01)
(Continued)

(52) U.S. Cl.
CPC .......... *G01N 27/82* (2013.01); *G01R 33/0094* (2013.01); *G01R 33/02* (2013.01); *G01R 33/1215* (2013.01)

(58) Field of Classification Search
CPC ...... G01N 27/82; G01N 3/60; G01R 33/1215; G01R 33/02; G01R 33/0094; G01R 33/093; Y10T 428/1107
(Continued)

(56) References Cited

U.S. PATENT DOCUMENTS

2012/0126803 A1* 5/2012 Goldfine ............ G01R 33/0094
                                                              324/239
2014/0176698 A1* 6/2014 Banerjee ................ G01N 21/21
                                                                348/92
2015/0330946 A1 11/2015 Davis et al.

FOREIGN PATENT DOCUMENTS

JP      2002-122571 A      4/2002
JP      2012-247194 A      12/2012
WO      2015/179237 A1     11/2015

OTHER PUBLICATIONS

Mao Bingyi et al: "Signal processing and defect analysis of pipeline inspection applying magnetic flux leakage methods", Intelligent Service Robotics, Springer Berlin Heidelberg, Berlin/Heidelberg, vol. 7, No. 4, Aug. 9, 2014 (pp. 203-209) (7 pages).
(Continued)

*Primary Examiner* — Douglas X Rodriguez
*Assistant Examiner* — Trung Q Nguyen
(74) *Attorney, Agent, or Firm* — Osha Bergman Watanabe & Burton LLP

(57) ABSTRACT

A material defect detection device that detects a material defect in a predetermined region of metallic equipment using a magnetic field distribution in the predetermined region measured by a magnetic sensor array including a plurality of magnetic sensors, the material defect detection
(Continued)

device including: a processor that calculates a density distribution of magnetic dipoles in the predetermined region based on the magnetic field distribution and calculates a depth distribution of material defect in the predetermined region based on the density distribution of the magnetic dipoles.

12 Claims, 13 Drawing Sheets

(51) Int. Cl.
*G01R 33/02* (2006.01)
*G01R 33/12* (2006.01)

(58) Field of Classification Search
USPC ...... 324/200, 207.11–207.15, 211, 220, 233, 324/240–244, 500, 529, 530
See application file for complete search history.

(56) References Cited

OTHER PUBLICATIONS

Nakasumi Shogo et al., "Inverse Analysis of Multiple Cracks Using Magnetic Flux Leakage Considering the Size of Flux Gate Sensor", AEM Japanese Academic Journal, vol. 21, No. 1, Oct. 16, 2013 (pp. 72-76) (6 pages).

* cited by examiner

MATERIAL DEFECT DETECTION DEVICE, MATERIAL DEFECT DETECTION SYSTEM, MATERIAL DEFECT DETECTION METHOD, AND NON-TRANSITORY COMPUTER READABLE STORAGE MEDIUM

CROSS REFERENCE TO RELATED APPLICATIONS

Priority is claimed on Japanese Patent Application No. 2016-216586, filed Nov. 4, 2016 and Japanese Patent Application No. 2017-000421, filed Jan. 5, 2017, the contents of which are incorporated herein by reference.

TECHNICAL FIELD

The present invention relates to a material defect detection device, a material defect detection system, a material defect detection method, and a non-transitory computer readable storage medium.

BACKGROUND

In equipment made of a metal (hereinafter referred to as "metallic facilities") used in petroleum and petrochemical plants and the like, a material defect phenomenon in which a thickness is reduced due to local corrosion and the like may occur. When such a material defect progresses, there is a risk of generation of holes in metallic equipment. Accordingly, it is necessary to detect material defects generated due to local corrosion and the like in metallic equipment distributed throughout a plant at an early stage.

In Patent Literature 1, the presence of a material defect can be detected according to pattern matching between a magnetic field strength pattern when a material defect has occurred (hereinafter referred to as a "material defect pattern") and a magnetic field strength pattern detected through a magnetic sensor using the fact that a static magnetic field decreases at a portion at which a material defect has occurred.

[Patent Literature 1]

PCT International Publication WO 2015/179237

However, in the system disclosed in Patent Literature 1, shape information such as a planar shape and depth of a material defect may not be able to be estimated even if the presence of a material defect in metallic equipment that is an inspection target can be detected. This is because a material defect pattern varies according to shape information such as a planar shape and depth of a material defect and a distance between a magnetic sensor and the material defect (hereinafter referred to as "standoff"). Accordingly, it is necessary to prepare material defect patterns for various material defect shapes and standoffs. However, since there is a large variety of material defect shapes, a great number of material defect patterns are required, which is not practical.

SUMMARY

One or more embodiments of the present invention provide a material defect device, a material defect detection system, a material defect detection method, and a program capable of easily estimating shape information of a material defect.

One or more embodiments of the present invention provide a material defect detection device for detecting a material defect in a predetermined region of metallic equipment using a magnetic field distribution in the predetermined region measured by a magnetic sensor array including a plurality of magnetic sensors, the material defect detection device including: a magnetic dipole density distribution calculator configured to calculate a density distribution of magnetic dipoles in the predetermined region based on the magnetic field distribution measured by the magnetic sensor array; and a depth distribution calculator configured to calculate a depth distribution of material defect in the predetermined region based on the density distribution of the magnetic dipoles.

According to one or more embodiments of the present invention, in the aforementioned material defect detection device, the magnetic dipole density distribution calculator includes: a magnetic dipole density distribution computation parameter storage which stores a magnetization quantity in the predetermined region; and a magnetic dipole density distribution computer configured to calculate a density distribution of magnetic dipoles in the predetermined region based on the magnetic field distribution measured by the magnetic sensor array and an estimation value of a magnetic flux density at the position of each magnetic sensor calculated from the magnetization quantity.

According to one or more embodiments of the present invention, in the aforementioned material defect detection device, the depth distribution calculator calculates a depth distribution of material defect in the predetermined region based on the density distribution of the magnetic dipoles and a coefficient set according to the magnetization quantity.

According to one or more embodiments of the present invention, in the aforementioned material defect detection device, the magnetic dipole density distribution computer calculates the density distribution of the magnetic dipoles by solving an optimization problem such that a difference between the magnetic field distribution measured by the magnetic sensor array and the estimation value is minimized under a constraint condition that the density distribution of the magnetic dipoles is a positive value.

According to one or more embodiments of the present invention, in the aforementioned material defect detection device, the magnetic dipole density distribution computer solves the optimization problem as a quadratic programming problem by spatially discretizing the density distribution of the magnetic dipoles.

According to one or more embodiments of the present invention, in the aforementioned material defect detection device, the magnetic dipole density distribution computer calculates a density distribution of magnetic dipoles in each of three-dimensional directions of a longitudinal direction of the predetermined region and a direction orthogonal to the longitudinal direction and sets a value obtained by averaging the calculated density distributions of magnetic dipoles in the three-dimensional directions to a density distribution of magnetic dipoles in the predetermined region.

According to one or more embodiments of the present invention, in the aforementioned material defect detection device, the magnetic dipole density distribution computer adds a regularization term to the optimization problem and solves the optimization problem having the regularization term added thereto.

According to one or more embodiments of the present invention, in the aforementioned material defect detection device, the magnetic dipole density distribution computer dimensionally reduces the optimization problem according to principal component analysis and solves the dimensionally reduced optimization problem.

According to one or more embodiments of the present invention, the aforementioned material defect detection device further includes a magnetization direction computer which computes a magnetization direction in the predetermined region of the metallic equipment based on the magnetic field distribution measured by the magnetic sensor array, wherein the magnetic dipole density distribution calculator calculates a density distribution of magnetic dipoles in the predetermined region based on the magnetic field distribution measured by the magnetic sensor array and the magnetization direction computed by the magnetization direction computer.

According to one or more embodiments of the present invention, in the aforementioned material defect detection device, the magnetization direction computer integrates a magnetic field distribution in a normal direction of the predetermined region among magnetic field distributions measured by the magnetic sensor array on a straight line in each of perpendicular directions with respect to the normal direction, and computes the magnetization direction based on integrated values obtained from integration on the straight line.

According to one or more embodiments of the present invention, in the aforementioned material defect detection device, the magnetization direction computer integrates the magnetic field distribution in the normal direction on each of a plurality of different straight lines parallel to the perpendicular directions in each of the perpendicular directions to acquire one-dimensional array data of the integrated values and determines a direction of the array data in which a sum of squares of the array data is minimized among the array data in each of the perpendicular directions as the magnetization direction.

One or more embodiments of the present invention provide a material defect detection system including the aforementioned material defect detection device and the magnetic sensor array.

According to one or more embodiments of the present invention, in the aforementioned material defect detection system, a distance in a normal direction of the surface of the predetermined region is constant between the position of each of the magnetic sensors and the surface of the predetermined region.

One or more embodiments of the present invention provide a material defect detection method for detecting a material defect in a predetermined region of metallic equipment using a magnetic field distribution in the predetermined region measured by a magnetic sensor array including a plurality of magnetic sensors, the material defect detection method including: a step of calculating a density distribution of magnetic dipoles in the predetermined region based on the magnetic field distribution measured by the magnetic sensor array; and a step of calculating a depth distribution of material defect in the predetermined region based on the density distribution of the magnetic dipoles.

One or more embodiments of the present invention provide a material defect detection method for detecting a material defect in a predetermined region of metallic equipment using a magnetic field distribution in the predetermined region measured by a magnetic sensor array including a plurality of magnetic sensors, the material defect detection method including: a step of computing a magnetization direction in the predetermined region of the metallic equipment based on the magnetic field distribution measured by the magnetic sensor array; a step of calculating a density distribution of magnetic dipoles in the predetermined region based on the magnetic field distribution measured by the magnetic sensor array and the magnetization direction; and a step of calculating a depth distribution of material defect in the predetermined region based on the density distribution of the magnetic dipoles.

One or more embodiments of the present invention provide a non-transitory computer readable storage medium storing a program for causing a computer to function as the aforementioned material defect detection device.

As described above, one or more embodiments of the present invention may easily estimate shape information of a material defect.

DETAILED DESCRIPTION

Figure 1:
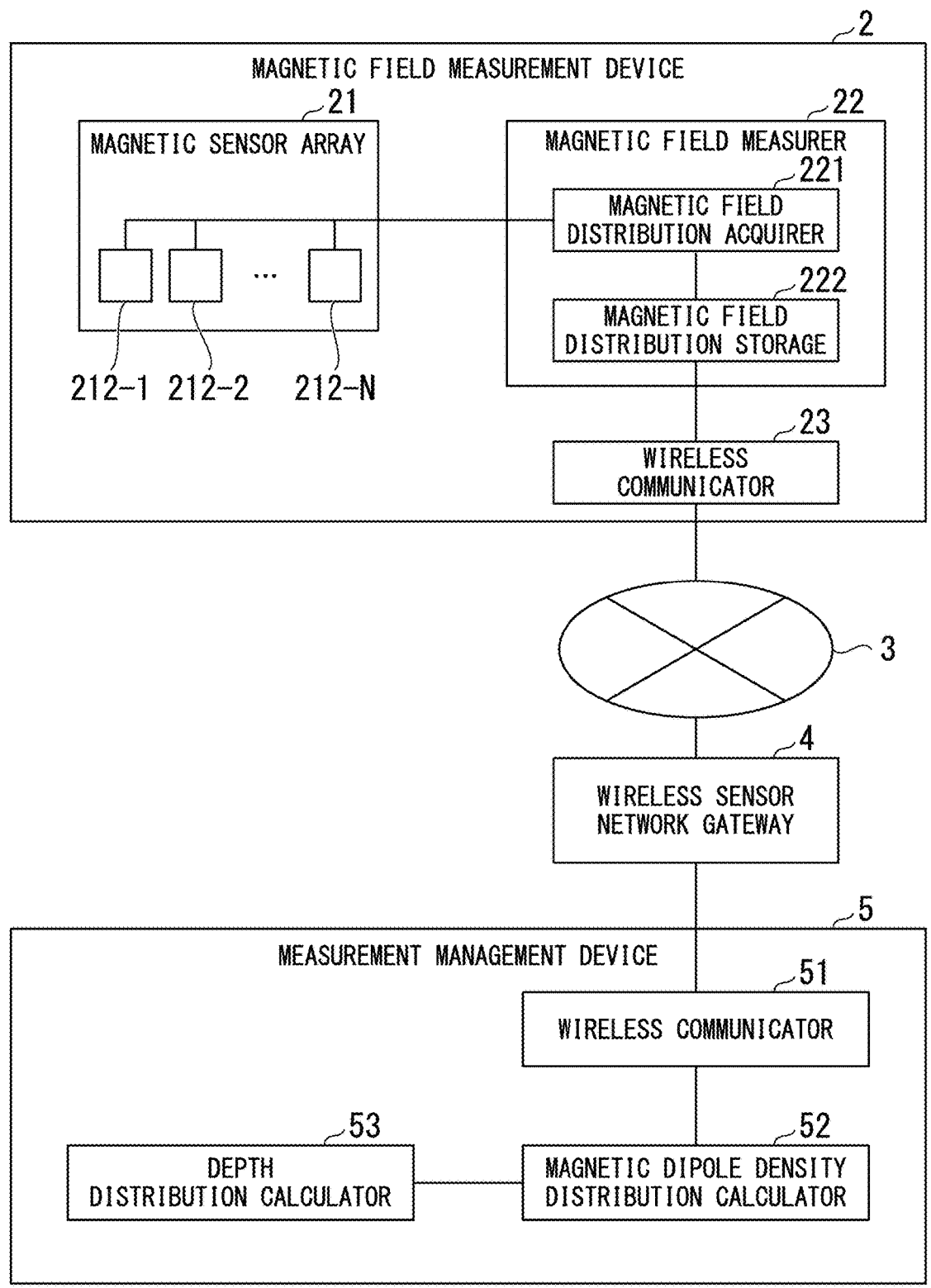
FIG. 1 is a diagram showing an example of a schematic configuration of a material defect detection device system 1 according to one or more embodiments.

Hereinafter, embodiments of the present invention will be described but the following embodiments do not limit the present invention with regard to the scope of the claim. In addition, all combinations of features described in the below embodiments are not necessary for the present invention. Meanwhile, the same or similar parts are represented by the same signs in the drawings and redundant description may be omitted. Further, shapes, sizes and the like of elements may be enlarged for clear illustration in the drawings.

Throughout the specification, when it is stated that a certain part "includes," "has" or "comprises" a specific element, this means that the part may further include other elements, which are not excluded, unless otherwise mentioned.

A material defect detection device according to one or more embodiments of the present invention detects a material defect in a predetermined region of metallic equipment using a magnetic field distribution of static magnetic fields in the predetermined region, which is measured by a plurality of magnetic sensors. Accordingly, it is possible to easily estimate the shape of the material defect in the predetermined region of the metallic equipment without using pattern matching.

Hereinafter, a material defect detection device system 1 including a material defect detection device according to one or more embodiments will be described using the drawings.

FIG. 1 is a diagram showing an example of a schematic configuration of the material defect detection device system 1 according to one or more embodiments. As shown in FIG. 1, the material defect detection device system 1 includes a magnetic field measurement device 2, a communication network 3, a wireless sensor network gateway 4 and a measurement management device 5. Meanwhile, the measurement management device 5 may be an example of a material defect detection device.

The magnetic field measurement device 2 transmits information to the measurement management device 5 through the communication network 3. Although the material defect detection device system 1 includes the wireless sensor network gateway 4 which performs relaying between the communication network 3 and the measurement management device 5 in one or more embodiments, the present invention is not limited thereto. That is, the wireless sensor network gateway 4 may be omitted.

The communication network 3 may be a transmission path of wireless communication or a combination of a transmission path of wireless communication and a transmission path of wired communication. The communication network 3 may be a mobile communication network such as a portable telephone network, a wireless packet communication network, the Internet, a private circuit, or a combination thereof.

The magnetic field measurement device 2 measures a magnetic field distribution of static magnetic fields in a predetermined region of metallic equipment. In addition, the magnetic field measurement device 2 transmits the measured magnetic field distribution of the predetermined region in the metallic equipment to the measurement management device 5 through the communication network 3. It is desirable that the metallic equipment be made of a ferromagnetic material and the metallic equipment may be a pipe made of a metal (hereinafter referred to as a "metallic pipe"), a tank, a reinforcing rod, or the like, installed in petroleum and petrochemical plants, for example. In one or more embodiments, a case in which the metallic equipment is a metallic pipe made of a ferromagnetic material is described.

Hereinafter, an example of a schematic configuration of the magnetic field measurement device 2 according to one or more embodiments will be described.

As shown in FIG. 1, the magnetic field measurement device 2 includes a magnetic sensor array 21, a magnetic field measurer 22 and a wireless communicator 23.

Figure 2:
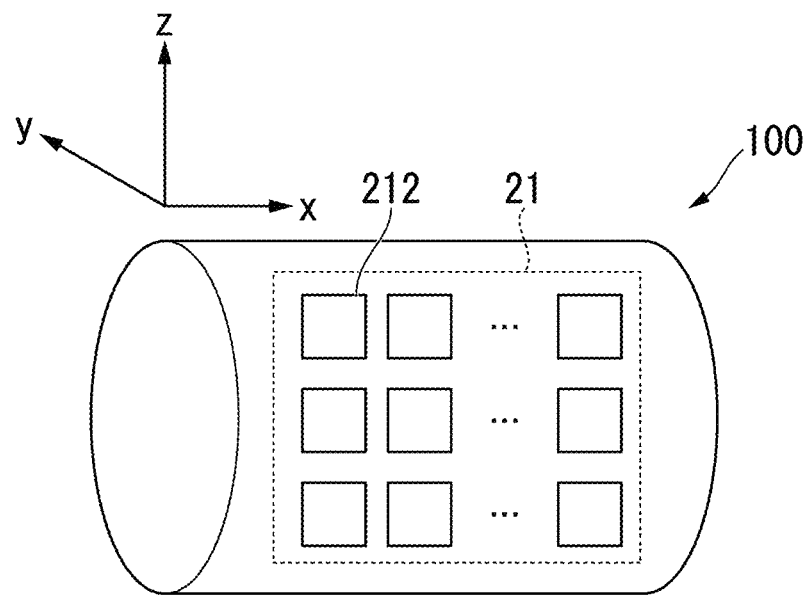
FIG. 2 is a diagram showing a mounting position of a magnetic sensor array 21 according to one or more embodiments.

The magnetic sensor array 21 includes a plurality of magnetic sensors 212 (magnetic sensors 212-1, 212-2, ... 212-N (N is an integer)). FIG. 2 is a diagram showing a mounting position of the magnetic sensor array 21 according to one or more embodiments.

The plurality of magnetic sensors 212 measure magnetic field densities.

Accordingly, when whether a material defect has occurred in a predetermined region (hereinafter referred to as a "monitoring region") 100 of metallic equipment is monitored, as shown in FIG. 2, the plurality of magnetic sensors 212 are mounted on the surface of the monitoring region 100. Accordingly, the magnetic sensor array 21 configured by disposing the plurality of magnetic sensors 212 can measure a magnetic field density distribution (hereinafter referred to as a "magnetic field distribution") of static magnetic fields in the monitoring region 100. Meanwhile, each magnetic sensor 212 may be disposed in contact with the surface of the monitoring region 100 in one or more embodiments. Further, each magnetic sensor 212 may be disposed such that a distance from the surface of the monitoring region 100 becomes a specific distance s. The plurality of magnetic sensors 212 output magnetic field densities measured thereby to the magnetic field measurer 22. Meanwhile, there are cases in which the x-axis direction shown in FIG. 2 is called a longitudinal direction of the metallic pipe, the y-axis direction is called a radial direction (or short side direction) of the metallic pipe, and the z-axis direction is called a normal direction of the metallic pipe.

Referring back to FIG. 1, the magnetic field measurer 22 includes a magnetic field distribution acquirer 221 and a magnetic field distribution storage 222.

The magnetic field distribution acquirer 221 acquires a magnetic field density measured by each magnetic sensor 212. That is, the magnetic field distribution acquirer 221 acquires a magnetic field distribution in the monitoring region 100 measured by the magnetic sensor array 21. In addition, the magnetic field distribution acquirer 221 stores the magnetic field density measured by each magnetic sensor 212 in the magnetic field distribution storage 222.

The wireless communicator 23 performs wireless communication with the measurement management device 5 through the communication network 3.

Figure 3:
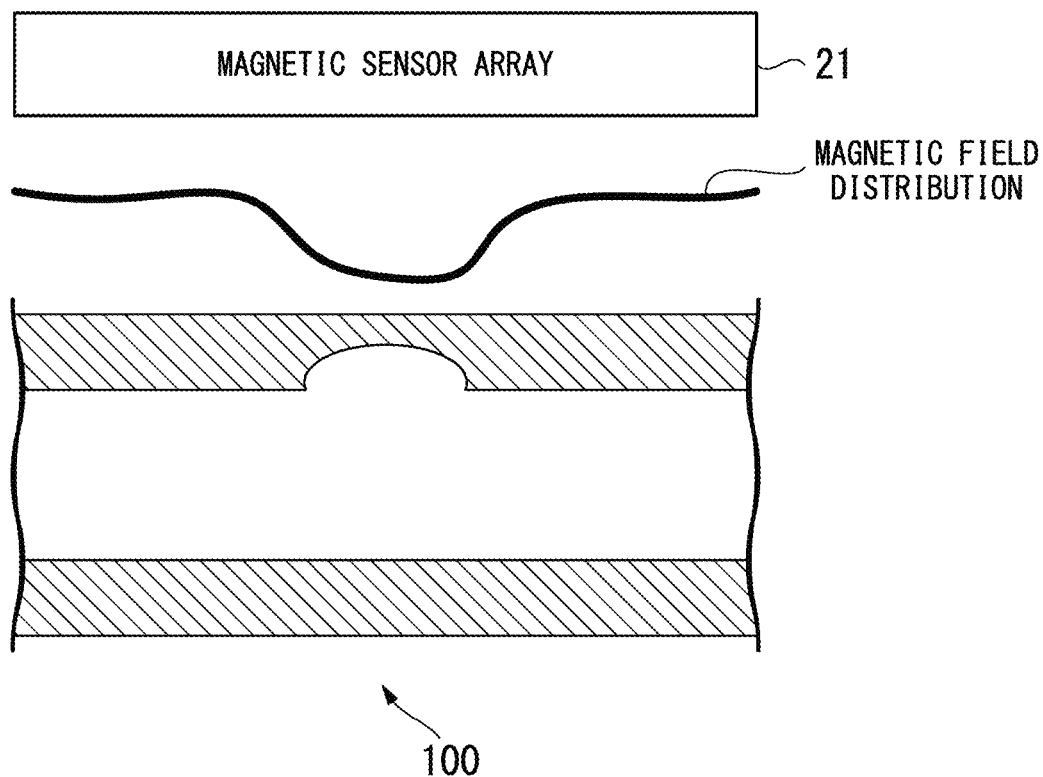
FIG. 3 is a diagram for describing a method of calculating a depth distribution of material defect from a density distribution of magnetic dipoles according to one or more embodiments.
Figure 4:
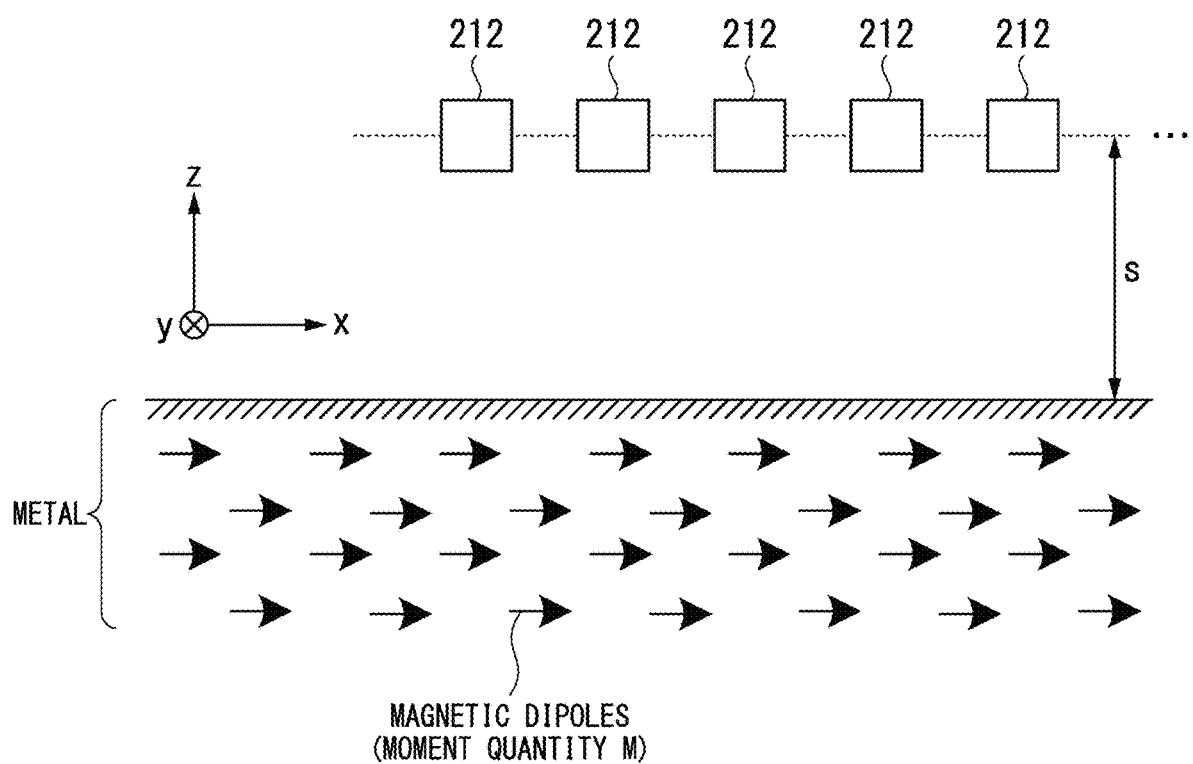
FIG. 4 is a schematic diagram of a density distribution of magnetic dipoles according to one or more embodiments.

The measurement management device 5 calculates a density distribution of magnetic dipoles in the monitoring region 100 based on the magnetic field distribution measured by the magnetic sensor array 21. In addition, the measurement management device 5 calculates a depth distribution of material defect in the monitoring region 100 based on the calculated density distribution of the magnetic dipoles. FIG. 3 is a diagram for describing a method of calculating a depth distribution of material defect from a density distribution of magnetic dipoles according to one or more embodiments. In addition, FIG. 4 is a schematic diagram of a density distribution of magnetic dipoles according to one or more embodiments.

The aforementioned magnetic dipole is a pair of positive and negative microscopic magnetic poles, in other words, a microscopic magnet. Accordingly, a magnetized metallic pipe (i.e., a metallic pipe having a residual magnetic field) can be considered to have uniform magnetic dipoles inside thereof, as shown in FIG. 4. Further, it is assumed that a magnetic dipole density is uniformly distributed throughout the metallic pipe in one or more embodiments. In this assumption, a density distribution of magnetic dipoles in the metallic pipe is uniform when a material defect does not occur in the metallic pipe. However, magnetic dipoles are not present at a portion at which the metallic pipe is missing due to a material defect. In addition, the magnetic dipole density decreases at a portion at which a material defect has occurred and thus the thickness of the metallic pipe has decreased. Here, since it is assumed that magnetic dipoles are uniformly distributed throughout the metallic pipe as described above, it is conceivable that the magnetic dipole density be proportional to the thickness of the metallic pipe. Accordingly, if the magnetic dipole density can be calculated, a depth distribution of material defect representing a distribution of material defect can be calculated. Further, such magnetic dipoles can be regarded as an eddy current flowing in a loop form. That is, a density distribution of magnetic dipoles can be regarded as a density distribution of an eddy current flowing in a loop form.

Hereinafter, an example of a schematic configuration of the measurement management device 5 according to one or more embodiments will be described.

Figure 5:
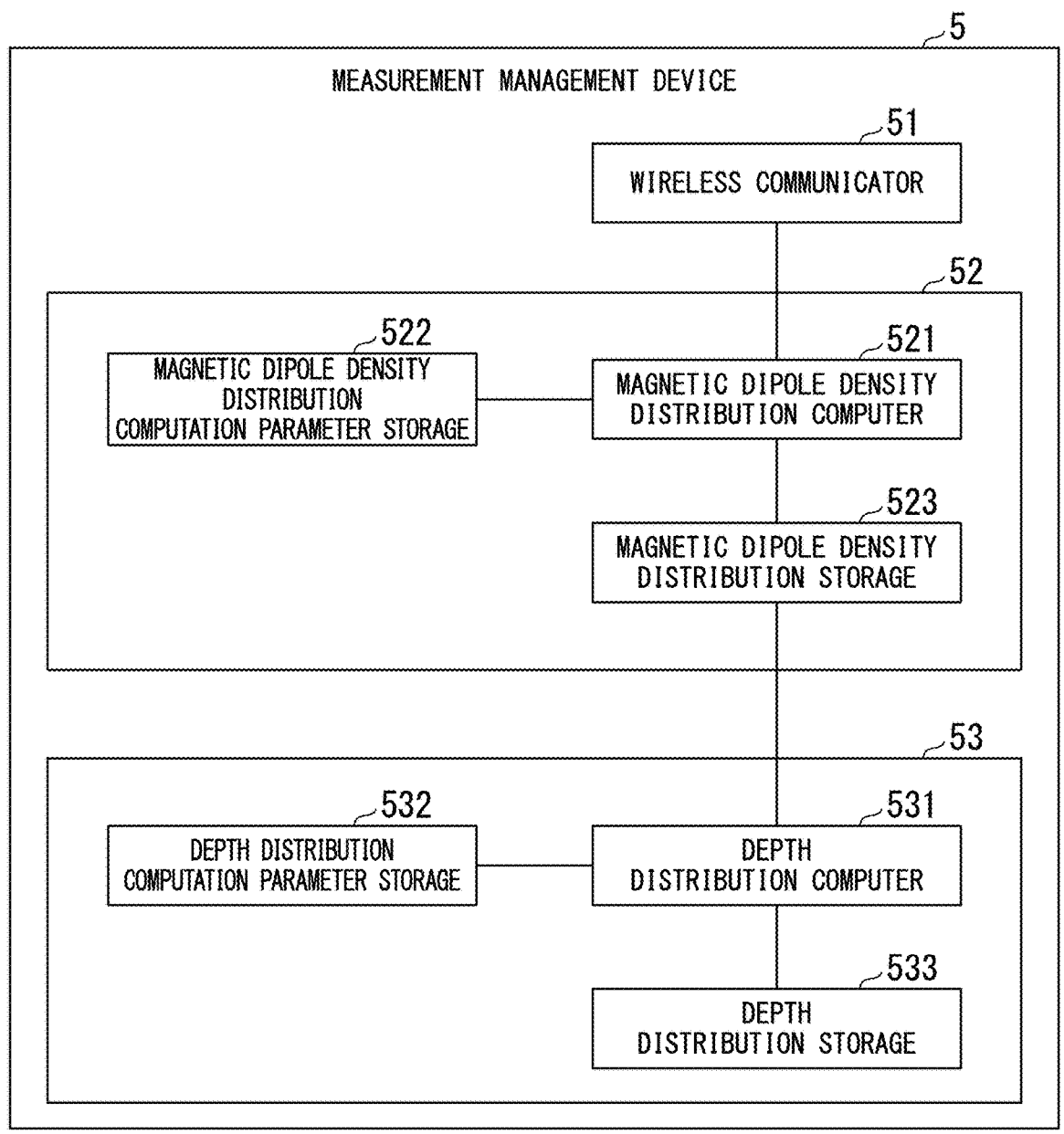
FIG. 5 is a diagram showing an example of a schematic configuration of a measurement management device 5 according to one or more embodiments.

FIG. 5 is a diagram showing an example of a schematic configuration of the measurement management device 5 according to one or more embodiments.

The measurement management device 5 includes a wireless communicator 51, a magnetic dipole density distribution calculator 52 and a depth distribution calculator 53.

The wireless communicator 51 performs wireless communication with the wireless communicator 23 through the wireless sensor network gateway 4 and the communication network 3.

As shown in FIG. 5, the magnetic dipole density distribution calculator 52 includes a magnetic dipole density distribution computer 521, a magnetic dipole density distribution computation parameter storage 522 and a magnetic dipole density distribution storage 523.

The magnetic dipole density distribution computer 521 acquires a magnetic field density stored in the magnetic field distribution storage 222 and measured by each magnetic sensor 212 through the wireless communicator 51. Then, the magnetic dipole density distribution computer 521 calculates a density distribution of magnetic dipoles in the monitoring region 100 based on the magnetic field density measured by each magnetic sensor 212, that is, the magnetic field distribution in the monitoring region 100. Meanwhile, a first parameter necessary for the magnetic dipole density distribution computer 521 to calculate a density distribution of magnetic dipoles based on the magnetic field distribution in the monitoring region 100 is stored in advance in the magnetic dipole density distribution computation parameter storage 522. Accordingly, the magnetic dipole density distribution computer 521 calculates a density distribution of magnetic dipoles in the monitoring region 100 using the first parameter. The magnetic dipole density distribution computer 521 stores the calculated density distribution of magnetic dipoles in the monitoring region 100 in the magnetic dipole density distribution storage 523.

Subsequently, the depth distribution calculator 53 includes a depth distribution computer 531, a depth distribution computation parameter storage 532 and a depth distribution storage 533.

The depth distribution computer 531 acquires the density distribution of magnetic dipoles stored in the magnetic dipole density distribution storage 523. Then, the depth distribution computer 531 calculates a depth distribution of material defect in the monitoring region 100 based on the acquired density distribution of magnetic dipoles. Meanwhile, a second parameter necessary for the depth distribution computer 531 to calculate a depth distribution of material defect based on the density distribution of magnetic dipoles in the monitoring region 100 is stored in advance in the depth distribution computation parameter storage 532. Accordingly, the depth distribution computer 531 calculates a depth distribution of material defect in the monitoring region 100 using the second parameter. This depth distribution of material defect is a distribution of material defect in the z-axis direction, that is, in the depth, and the size of the distribution represents the surface shape of the material defect. Accordingly, the depth distribution computer 531 can easily estimate shape information such as the depth and surface shape of a material defect by calculating a depth distribution of material defect in the monitoring region 100.

For example, when a depth distribution of material defect is set to τ(x, y) and a density distribution of magnetic dipoles is set to ω (x, y), the depth distribution computer 531 can calculate the depth distribution of material defect τ(x, y) according to the following mathematical expression.

[Math. 1]

$$\tau(x,y) = \alpha \omega(x,y) \quad (1)$$

Meanwhile, a coefficient α is a constant determined by a magnetization quantity of the monitoring region 100 in the metallic equipment and is stored in the depth distribution storage 533 as the second parameter. The depth distribution computer 531 stores the calculated depth distribution of material defect in the monitoring region 100 in the depth distribution storage 533.

(Method of Calculating Density Distribution of Magnetic Dipoles)

Hereinafter, a method of calculating a density distribution of magnetic dipoles in the magnetic dipole density distribution computer 521 will be described in detail.

In one or more embodiments, a total number of magnetic sensors 212 of the magnetic sensor array 21 is set to N, and a subscript k labels each magnetic sensor 212. Further, the subscript k is represented as follows.

[Math. 2]

$$k \in \{1, 2, \ldots, N\} \triangleq K \quad (2)$$

In addition, coordinates of a magnetic sensor 212 with the label k are set to $(x_k, y_k, s)$. The value s is a distance in the z direction from each magnetic sensor 212 to the surface of the metallic equipment, as described, and is a common value in all magnetic sensors 212. When a magnetic flux density measured by a magnetic sensor 212 with the label k is set to a magnetic flux density $b_k$, the magnetic flux density $b_k$ is represented by the following mathematical expression.

[Math. 3]

$$b_k \triangleq (b_k^x, b_k^y, b_k^z) \quad (3)$$

In addition, when a magnetization quantity (magnetic dipole moment) in the monitoring region 100 is set to a magnetization quantity M, the magnetization quantity M is represented by the following mathematical expression.

[Math. 4]

$$M \triangleq (M_x, M_y, M_z)^T \quad (4)$$

Meanwhile, this magnetization quantity M is uniform in the monitoring region 100. In this case, the magnetic dipole density distribution computer 521 can obtain a magnetic dipole density distribution $\omega_x(x, y)$ by solving an optimization problem represented by the following mathematical expression under a constraint condition that a magnetic dipole density distribution $\omega_x(p, q)$ is a positive value.

[Math. 5]

$$P_x: \begin{cases} \min_{\omega_x} \sum_{k \in K} \left\| b_k^x - \int\int_{R^2} \omega_x(p,q)\phi_s^x(x_k - p, y_k - q)dpdq \right\|^2, \\ \text{s.t. } \omega_x(p,q) \geq 0 \text{ for all } p, q \in R, \end{cases} \quad (5)$$

Meanwhile, p corresponds to x and q corresponds to y in one or more embodiments. In addition, R indicates a real number set. Further, $b_k^x$ indicates a magnetic flux density in the x-axis direction, measured by a magnetic sensor 212 with the label k, that is, a k-th magnetic sensor 212.

Here, a magnetic flux density $\varphi_s^x(x, y)$ in the x-axis direction generated at a position (x, y, s) by a magnetic dipole present at the origin is represented by the following mathematical expression.

[Math. 6]

$$\phi_s^x(x, y) \triangleq -\frac{\mu_0}{4\pi}\left(\frac{M_x}{\sqrt{x^2+y^2+z^2}^3} - \frac{3x(xM_x + yM_y + sM_z)}{\sqrt{x^2+y^2+z^2}^5}\right) \quad (6)$$

Meanwhile, although a subscript "s" of "$\varphi_s^x(x, y)$" should be written right below the superscript "x", as shown in mathematical expression (6), it may be written as "$\varphi_s^x(x, y)$" in the description due to writing restrictions. The same may apply to other same subscripts.

Accordingly, a magnetic flux density b(x, y, z) generated at the position (x, y, s) by the metallic equipment having the magnetic dipole density distribution ω(x, y) is represented as the following mathematical expression.

[Math. 7]

$$b(x,y,s) = \int\int_{R^2} \omega_x(p,q)\phi_s^x(x_k - p, y_k - q)dpqd \quad (7)$$

Accordingly, mathematical expression (5) can be converted into the following mathematical expression.

[Math. 8]

$$P_x: \begin{cases} \min_{\omega_x} \sum_{k \in K} \|b_k^x - b(x, y, s)\|^2 \\ \text{s.t. } \omega_x(p,q) \geq 0 \text{ for all } p, q \in R \end{cases} \quad (8)$$

In this manner, the magnetic dipole density distribution computer 521 calculates a magnetic dipole density distribution $\omega_x$ by solving the optimization problem Px such that a difference between a magnetic flux density (magnetic field distribution) measured by each magnetic sensor 212 and an estimation value of a magnetic flux density at the position of each magnetic sensor 212, calculated from the magnetization quantity of the monitoring region 100, is optimized under a constraint condition that a density distribution of magnetic dipoles is a positive value.

In addition, the magnetic dipole density distribution computer 521 may conclude the optimization problem Px of mathematical expression (5) as a general quadratic programming problem by spatially randomizing the magnetic dipole density distribution $\omega_x$. For example, the optimization problem P'x concluded as a quadratic programming problem is represented by the following mathematical expression.

[Math. 9]

$$P'_x: \begin{cases} \min_{\omega'_x \in R^{|I \times J|}} \|b'^x - \Phi_s^x \omega'_x\|^2, \\ \text{s.t. } \omega'_x \geq 0, \end{cases} \quad (9)$$

Here, $\omega_x(i, j)$ is a value obtained by randomizing a function $\omega_x$ and is represented by the following mathematical expression.

[Math. 10]

$$\omega_x(i,j) \in R, i,j \in I \times J \quad (10)$$

In addition, $w'_x$ is a value obtained by vectorizing $\omega_x(i, j)$ and is represented by the following mathematical expression.

[Math. 11]

$$\omega'_x \in R^{|I \times J|} \quad (11)$$

Further, $\Phi_s^x$ is a value obtained by converting a magnetic flux density $\phi_s^x(x_k - p_i, y_k - q_j)\Delta p \Delta q$ into a matrix and is represented by the following mathematical expression.

[Math. 12]

$$\Phi_s^x \in R^{|K| \times |I \times J|} \quad (12)$$

In addition, $b'^x$ is a value obtained by vectorizing a magnetic flux density $b_k^x$ and is represented by the following mathematical expression.

[Math. 13]

$$b'^x \in R^k \quad (13)$$

$b'^x \in R^k$

Accordingly, the magnetic dipole density distribution computer 521 can calculate a density distribution of magnetic dipoles by solving the optimization problem P'x (mathematical expression (9)) concluded as a quadratic programming problem through a primal-dual interior point method, for example.

Meanwhile, although the magnetic dipole density distribution computer 521 uses only a magnetic flux density $b_k^x$ in the x-axis direction among magnetic flux densities measured by the magnetic sensors 212 in the above-described embodiments, the present invention is not limited thereto and a density distribution of magnetic dipoles may be calculated using magnetic flux densities $b_k^y$ and $b_k^z$ in the y-axis direction and the z-axis direction. Accordingly, the magnetic dipole density distribution computer 521 can calculate a density distribution of magnetic dipoles with higher accuracy. In such a case, $\varphi_s^y(x, y)$ and $\varphi_s^z(x, y)$ represented below are used instead of the magnetic flux density $\varphi_s^x(x, y)$.

[Math. 14]

$$\Phi_s^y(x, y) \triangleq -\frac{\mu_0}{4\pi}\left(\frac{M_y}{\sqrt{x^2+y^2+z^2}^3} - \frac{3y(xM_x + yM_y + sM_z)}{\sqrt{x^2+y^2+z^2}^5}\right) \quad (14)$$

[Math. 15]

$$\Phi_s^z(x, y) \triangleq -\frac{\mu_0}{4\pi}\left(\frac{M_z}{\sqrt{x^2+y^2+z^2}^3} - \frac{3z(xM_x + yM_y + sM_z)}{\sqrt{x^2+y^2+z^2}^5}\right) \quad (15)$$

In addition, the magnetic dipole density distribution computer 521 may combine depth distributions of material defect in the x-axis, y-axis and z-axis directions, which are calculated using magnetic flux densities in the x-axis, y-axis and z-axis directions, through an averaging process in the above-described embodiments. Accordingly, the magnetic dipole density distribution computer 521 can calculate a depth distribution of material defect with higher accuracy. That is, the magnetic dipole density distribution computer 521 calculates magnetic dipole density distributions $\omega_x$, $\omega_y$ and $\omega_z$ in the x-axis, y-axis and z-axis directions, that is, in three-dimensional directions of a longitudinal direction of a predetermined region and a direction orthogonal thereto by solving the optimization problem Px of mathematical expression (5) and optimization problems Py and Pz represented below.

[Math. 16]

$$P_y: \begin{cases} \min_{\omega_y} \sum_{k \in K} \left\| b_k^y - \iint_{R^2} \omega_y(p, q)\phi_s^y(x_k - p, y_k - q)dpdq \right\|^2, \\ \text{s.t. } \omega_y(p, q) \geq 0 \text{ for all } p, q \in R, \end{cases} \quad (16)$$

[Math. 17]

$$P_z: \begin{cases} \min_{\omega_z} \sum_{k \in K} \left\| b_k^z - \iint_{R^2} \omega_z(p, q)\phi_s^z(x_k - p, y_k - q)dpdq \right\|^2, \\ \text{s.t. } \omega_z(p, q) \geq 0 \text{ for all } p, q \in R, \end{cases} \quad (17)$$

In addition, the magnetic dipole density distribution computer 521 sets a density distribution of magnetic dipoles in the monitoring region 100 to $\omega$ and regards $\omega$ as the average of magnetic dipole density distributions $\omega_x$, $\omega_y$ and $\omega_z$ represented by the following mathematical expression.

[Math. 18]

$$\omega = \frac{\omega_x + \omega_y + \omega_z}{3} \quad (18)$$

In addition, the magnetic dipole density distribution computer 521 can calculate a density distribution of magnetic dipoles with higher accuracy by appropriately applying a normalization term $L_2$ and a normalization term $L_1$ to the optimization problem P'x (mathematical expression (9)) concluded as a quadratic programming problem in the above-described embodiments. For example, the magnetic dipole density distribution computer 521 calculates a magnetic dipole density distribution $\omega_x$ by solving an optimization problem P''' generated by adding the normalization term $L_1$ to mathematical expression (9), as represented by the following mathematical expression.

[Math. 19]

$$P_x'': \begin{cases} \min_{\omega_x' \in R^{|J \times J|}} \| b'^x - \Phi_s^x \omega_x' \|^2 + \lambda \| \omega_x' \|_1, \\ \text{s.t. } \omega_x' \geq 0, \end{cases} \quad (19)$$

However, $\|\cdot\|$ is normal $L_2$ norm and $\|\cdot\|$ is $L_1$ norm. In addition, $\lambda \in R$ is a weighting factor of a regularization term. If the regularization term is $L_2$ norm, the magnetic dipole density distribution computer 521 can solve the optimization problem P''x through a primal-dual interior point method as in a case in which a regularization term is not present. However, when the regularization term is $L_1$ norm, the magnetic dipole density distribution computer 521 cannot solve the optimization problem P'' through the primal-dual interior point method because an objective function is not a quadratic form. Accordingly, the magnetic dipole density distribution computer 521 needs to solve the optimization problem P''x using a numerical solution to a nonlinear programming problem, such as sequential quadratic programming.

In addition, in the above-described embodiments, the magnetic dipole density distribution computer 521 can rapidly obtain a depth distribution of material defect while minimizing degradation of calculation results by degrading the optimization problems P' and P''x through principal component analysis. Hereinafter, a method of degrading the optimization problem P''x through principal component analysis will be described.

For example, the matrix $\Phi_s^x$ is set to $\Phi$, the vector $b'^x$ is set to b, the vector $\omega_x'$ is set to $\omega$, and the dimension of the matrix $\Phi$ is set to m×n. In addition, an i-th largest eigenvalue of the matrix $\Phi\Phi^T$ is set to $\lambda_i$ and an eigenvector corresponding to the eigenvalue $\lambda_i$ is set to $G_i$. Here, i is equal to or greater than 1 and equal to or less than m ($1 \leq i \leq m$). Further, a matrix obtained by arranging the eigenvector $G_i$ in a column direction in a range in which i is equal to or greater than 1 and equal to or less than k ($1 \leq i \leq k$) is set to a matrix C. That is, the matrix C is represented by the following mathematical expression. Meanwhile, the eigenvalue of the matrix $\Phi\Phi^T$ is non-negative.

[Math. 20]

$$C \triangleq \{G_1, G_2, \ldots, G_k\}, \quad (20)$$

However, k needs to be determined such that it satisfies the following relational expression.

[Math. 21]

$$\frac{\lambda_1^2 + \ldots + \lambda_k^2}{\lambda_1^2 + \ldots + \lambda_k^2 + \ldots + \lambda_m^2} \leq 0.99, \quad (21)$$

The left part of this relational expression is a value called a contribution ratio of eigenvalues $\lambda_1, \ldots, \lambda_k$ and the right part can be arbitrarily set in the range of 0 to 1. This contribution ratio is a parameter for controlling trade-off between dimension reduction and a calculation result degradation degree. When the right part of the relational expression is set to a large value, calculation result degradation can be prevented but degrading effects decrease. On the other hand, when the right part of the relational expression is set to a small value, degrading effects increase but calculation result degradation also increases. When the optimization problem P''x is dimensionally reduced through principal component analysis using the matrix C, the optimization problem P''x can be converted into an optimization problem P'''x represented below.

[Math. 22]

$$P'''_x : \begin{cases} \min_{\omega'_x \in R^{|I \times J|}} \|Cb'^x - C\Phi^x_s \omega'_x\|^2 + \lambda\|\omega_x\|_1, \\ \text{s.t. } \omega'_x \geq 0, \end{cases} \quad (22)$$

Accordingly, the magnetic dipole density distribution computer 521 can rapidly calculate a density distribution of magnetic dipoles by solving the optimization problem P'''x. Meanwhile, parameters which are necessary when the above-described optimization problems are solved to calculate a density distribution of magnetic dipoles, for example, a distribution function $\varphi^x_s$ of a magnetic field in which a single dipole is generated, a regularization function of an optimization problem, a weighting factor of a regularization term of an optimization problem, a magnetization quantity M and the like are stored in the magnetic dipole density distribution computation parameter storage 522 as first parameters.

Figure 6:
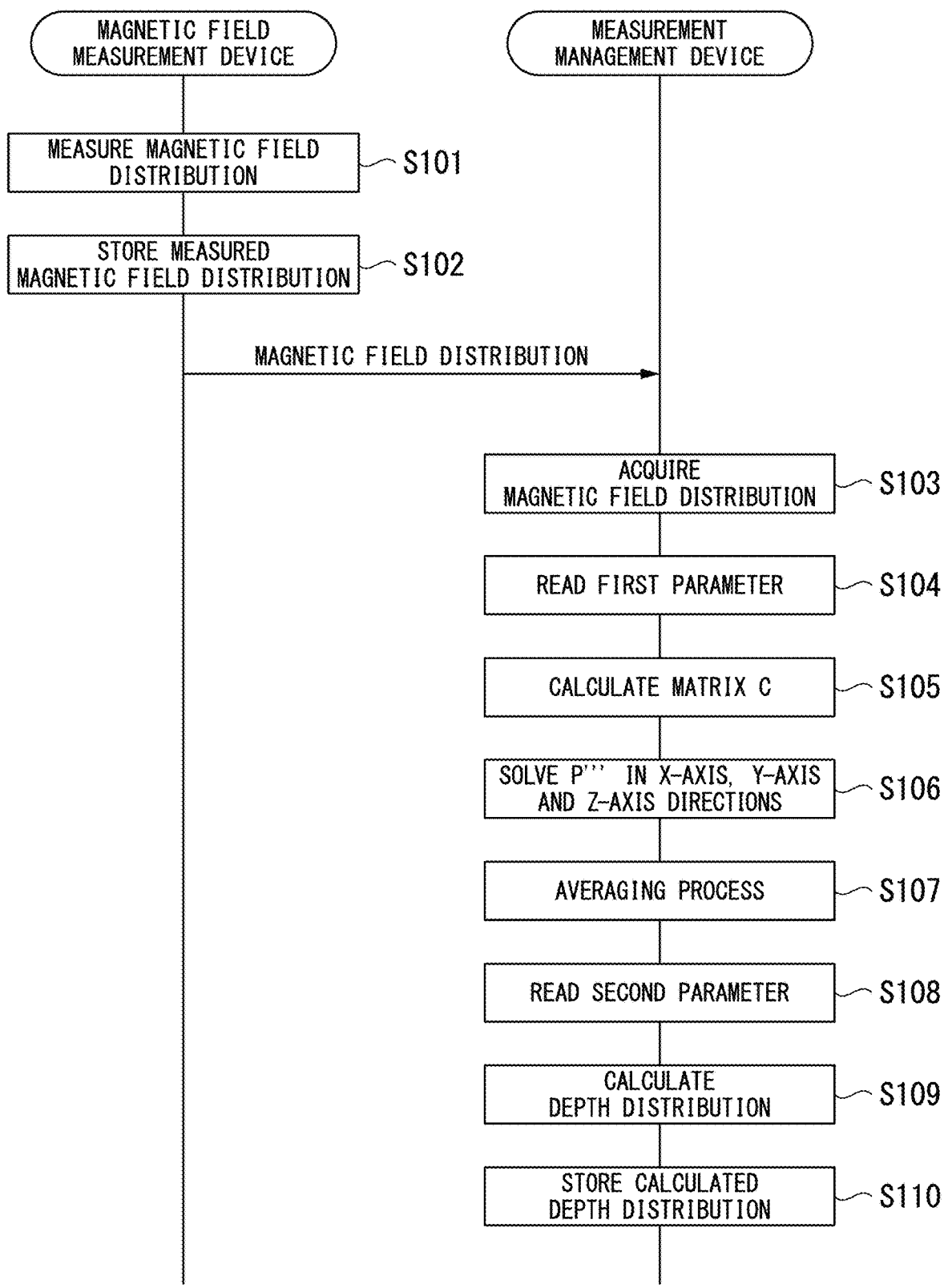
FIG. 6 is a sequence diagram of the material defect detection device system 1 according to one or more embodiments.

Next, a flow of a method of calculating a material defect in the material defect detection device system 1 will be described. FIG. 6 is a sequence diagram of the material defect detection device system 1 according to one or more embodiments.

The magnetic sensor array 21 measures a magnetic field distribution in a predetermined region of metallic equipment (step S101). The magnetic field distribution acquirer 221 acquires a magnetic field distribution in the monitoring region 100 measured by the magnetic sensor array 21. Then, the magnetic field distribution acquirer 221 stores a magnetic field density measured by each of the plurality of magnetic sensors 212 in the magnetic field distribution storage 222 (step S102).

The magnetic dipole density distribution computer 521 acquires a magnetic field distribution in the monitoring region 100 stored in the magnetic field distribution storage 222 through the wireless communicator 51 (step S103). The magnetic dipole density distribution computer 521 reads the first parameter from the magnetic dipole density distribution computation parameter storage 522 (step S104).

The magnetic dipole density distribution computer 521 calculates the matrix C for degrading optimization problems (step S105). Then, the magnetic dipole density distribution computer 521 calculates a magnetic dipole density distribution Wx by solving the optimization problem P'''x with respect to a magnetic field distribution in the x-axis direction through the sequential quadratic programming method. The magnetic dipole density distribution computer 521 calculates a magnetic dipole density distribution $\omega_y$ by solving an optimization problem P'''y with respect to a magnetic field distribution in the y-axis direction through the sequential quadratic programming method. The magnetic dipole density distribution computer 521 calculates a magnetic dipole density distribution $\omega_z$ by solving an optimization problem P'''z with respect to a magnetic field distribution in the z-axis direction through the sequential quadratic programming method (step S106).

The magnetic dipole density distribution computer 521 calculates a magnetic dipole density distribution ω in the monitoring region 100 by averaging the calculated magnetic dipole density distributions $\omega_x$, $\omega_y$ and $\omega_z$ (step S107). The magnetic dipole density distribution computer 521 stores the calculated magnetic dipole density distribution ω in the magnetic dipole density distribution storage 523.

The depth distribution computer 531 acquires the magnetic dipole density distribution ω stored in the magnetic dipole density distribution storage 523. The depth distribution computer 531 reads a coefficient α from the depth distribution computation parameter storage 532 as a second parameter (step S108). The depth distribution computer 531 calculates a depth distribution of material defect τ (x, y) in the monitoring region 100 by multiplying the magnetic dipole density distribution ω by the coefficient α (step S109). Then, the depth distribution computer 531 stores the calculated depth distribution of material defect τ(x, y) in the depth distribution storage 533 (step S110).

As described above, the measurement management device 5 (material defect detection device) according to one or more embodiments calculates a density distribution of magnetic dipoles in the monitoring region 100 based on a magnetic field distribution measured by each magnetic sensor 212 (magnetic sensor array 21). Then, the measurement management device 5 calculates a depth distribution of material defect in the monitoring region 100 based on the calculated density distribution of magnetic dipoles. Accordingly, the measurement management device 5 can easily estimate shape information of a material defect in the monitoring region 100 of metallic equipment without using pattern matching.

A magnetic field distribution provided to the magnetic dipole density distribution computer 521 may be replaced by a difference between a measured magnetic field density and a magnetic field density (hereinafter referred to as a "reference magnetic field") measured before a material defect occurs in the metallic equipment. Various external magnetic fields such as geomagnetism and magnetic fields from the metallic equipment may be included in the measured magnetic field distribution in addition to a signal from a material defect and such external magnetic fields may have a bad influence on computation of a density distribution of magnetic dipoles. It is possible to reduce the influence of the aforementioned external magnetic fields and minimize adverse effects due to the external magnetic fields by replacing the magnetic field distribution provided to the magnetic dipole density distribution computer 521 with a difference between a measured magnetic field and the reference magnetic field.

The aforementioned reference magnetic field may be approximately created from a measured magnetic field. For example, a signal from a material defect is a signal having a spatially high frequency, whereas an external magnetic field is composed of signals having spatially low frequencies. In view of this, it is possible to approximately create the reference magnetic field by applying a low pass filter or a filter having the same function as that of a low pass filter to a measured magnetic field. As a low pass filter or a filter having the same function as that of a low pass filter, a two-dimensional FFT, kernel regression and the like are conceivable. Kernel regression can provide the same effects as those of a low pass filter by employing a Gaussian function having a high variance value as a kernel function.

Hereinafter, a material defect detection device system 1A including a material defect detection device according to one or more embodiments will be described using the drawings.

Here, although the method of calculating a material defect of metallic equipment under a precondition that a magnetization direction of the metallic equipment is known has been described in one or more embodiments, a method of calculating a magnetization direction of the metallic equipment from a measured magnetic field distribution will be described in detail below. That is, according to one or more embodiments, the material defect detection device calculates a magnetization direction of the metallic equipment from a measured magnetic field distribution and calculates a material defect of the metallic equipment from a density distribution of magnetic dipoles using the calculated magnetization direction in the metallic equipment.

Figure 7:
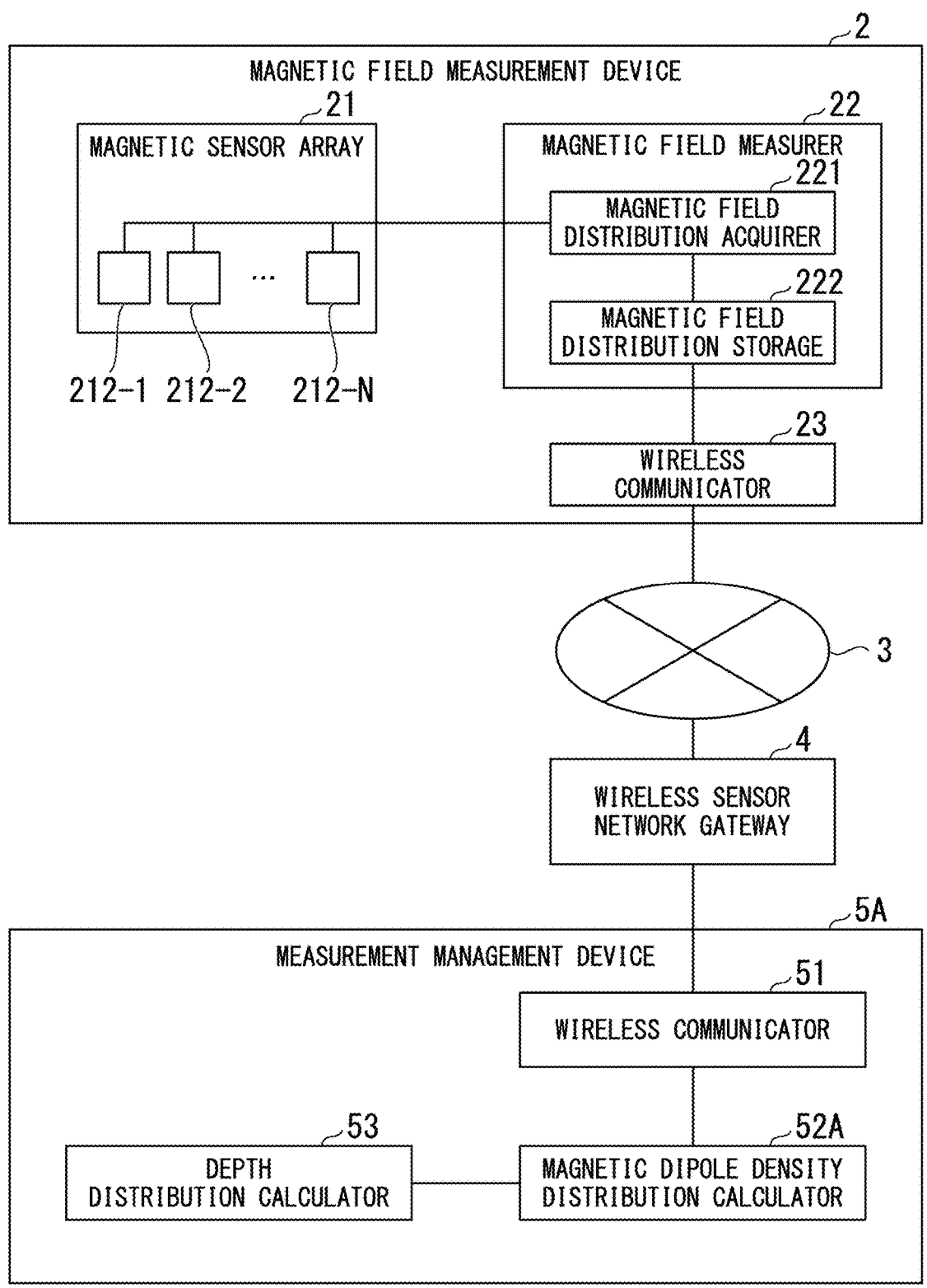
FIG. 7 is a diagram showing an example of a schematic configuration of a material defect detection device system 1A according to one or more embodiments.

FIG. 7 is a diagram showing an example of a schematic configuration of the material defect detection device system 1A according to one or more embodiments. As shown in FIG. 7, the material defect detection device system 1A includes the magnetic field measurement device 2, the communication network 3, the wireless sensor network gateway array 4 and a measurement management device 5A. Meanwhile, the measurement management device 5A may be an example of a material defect detection device.

Figure 8:
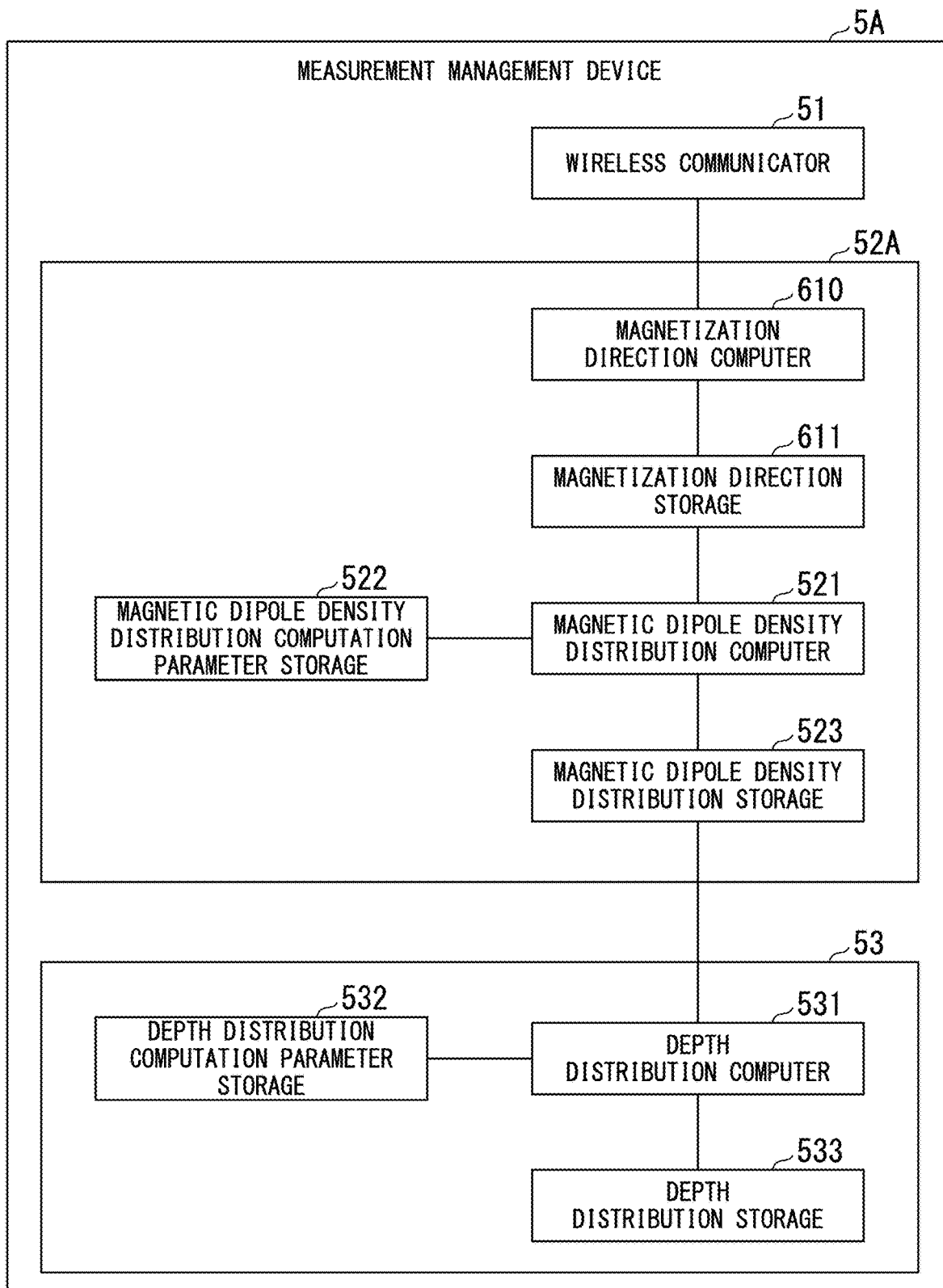
FIG. 8 is a diagram showing an example of a schematic configuration of a measurement management device 5A according to one or more embodiments.

FIG. 8 is a diagram showing an example of a schematic configuration of the measurement management device 5A according to one or more embodiments.

The measurement management device 5A includes the wireless communicator 51, a magnetic dipole density distribution calculator 52A and a depth distribution calculator 53.

As shown in FIG. 8, the magnetic dipole density distribution calculator 52A includes a magnetization direction computer 610, a magnetization direction storage 611, the magnetic dipole density distribution computer 521, the magnetic dipole density distribution computation parameter storage 522 and the magnetic dipole density distribution storage 523.

The magnetization direction computer 610 acquires a magnetic field distribution in the monitoring region 100, stored in the magnetic field distribution storage 222, through the wireless communicator 51.

The magnetization direction computer 610 computes a magnetization direction in the monitoring region 100 based on the acquired magnetic field distribution in the monitoring region 100. Here, the magnetization direction is a direction of magnetic dipoles in the monitoring region 100. For example, the magnetization direction computer 610 computes a direction of magnetic dipoles in the monitoring region 100 based on the acquired magnetic field distribution in the monitoring region 100.

For example, the magnetization direction computer 610 integrates a magnetic field distribution in the z direction which is a normal direction in the magnetic field distribution in the monitoring region 100 on a straight line in each of perpendicular directions with respect to the z direction. Then, the magnetization direction computer 610 computes a magnetization direction in the monitoring region 100 based on integrated values obtained from integration on straight lines. The magnetization direction computer 610 stores the computed magnetization direction in the magnetization direction storage 611.

The magnetic dipole density distribution computer 521 calculates a density distribution of magnetic dipoles in the monitoring region 100 based on a magnetic field distribution measured by the magnetic sensor array and the magnetization direction computed by the magnetization direction computer 610. Specifically, the magnetic dipole density distribution computer 521 acquires a magnetic field density measured by each magnetic sensor 212, stored in the magnetic field distribution storage 222, through the wireless communicator 51. In addition, the magnetic dipole density distribution computer 521 reads a first parameter from the magnetic dipole density distribution computation parameter storage 522. Further, the magnetic dipole density distribution computer 521 acquires the magnetization direction in the monitoring region 100, stored in the magnetization direction storage 611. Then, the magnetic dipole density distribution computer 521 calculates a density distribution of magnetic dipoles in the monitoring region 100 based on the magnetic field distribution in the monitoring region 100, the first parameter and the magnetization direction in the monitoring region 100.

Meanwhile, a method of calculating a density distribution of magnetic dipoles in the monitoring region 100 is the same as that in one or more embodiments described above and thus description thereof is omitted. Hereinafter, a method of calculating a magnetization direction in the monitoring region 100 in the magnetization direction computer 610 will be described in detail.

(Magnetization Direction Calculation Principle)

In one or more embodiments of the present invention, magnetized metallic equipment is regarded as an aggregate of uniform magnetic dipoles inside thereof, as shown in FIG. 4. In addition, the magnetization direction computer 610 according to one or more embodiments calculates a direction of the uniformly distributed magnetic dipoles, that is, a magnetization direction.

Figure 9:
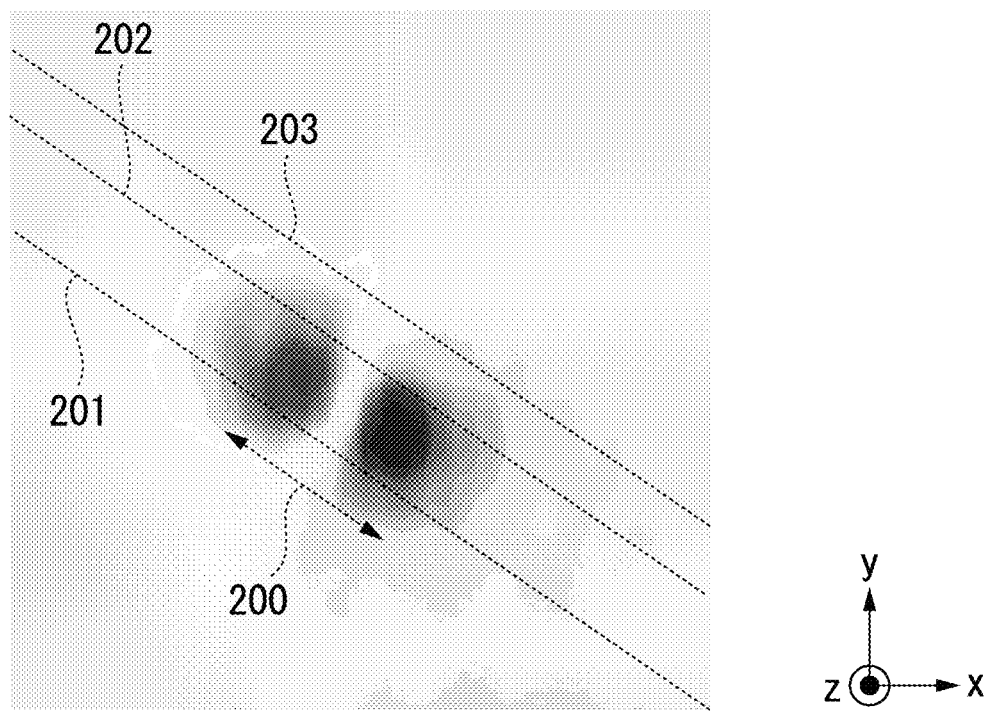
FIG. 9 is a diagram showing a magnetic field distribution in a z direction when a magnetization direction of a metallic pipe has been approximated to a direction parallel to an xy plane according to one or more embodiments.

Here, three directions of the x axis, y axis and z axis are conceived as magnetization directions of a metal plate. However, a metal plate has a property that it is difficult to magnetize in a short direction in general. Accordingly, magnetization hardly occurs in the z-axis direction which is a normal direction of the metal plate. Therefore, it is possible to approximate a magnetization direction of a metallic pipe to a direction parallel to an xy plane in one or more embodiments. FIG. 9 is a diagram showing a magnetic field distribution in the z direction when a magnetization direction of a metallic pipe has been approximated to a direction parallel to the xy plane, according to one or more embodiments. As shown in FIG. 9, since a magnetic dipole is a pair of positive and negative magnetic poles, two magnetic field distribution regions of a positive region and a negative region appear when viewed in the z-axis direction. In addition, a direction 200 which is a direction connecting the positive region and the negative region becomes a direction of the magnetic dipole, that is, a magnetization direction in FIG. 9. In this case, integrated values obtained by integrating a magnetic field distribution on a straight line become 0 in any direction if the direction is parallel to the magnetization direction 200. For example, if each of straight lines 201, 202 and 203 is parallel to the direction 200, even when magnetic field distributions in the z direction are integrated on the straight lines 201, 202 and 203, all of the integrated values become 0.

Specifically, when a magnetic dipole direction (i.e., magnetization direction) M is $M=(M_x, 0, 0)^T$, that is, when M is parallel to the x axis, a magnetic flux density distribution $\varphi^z_s(x, y)$ in the z direction in which a single magnetic dipole is generated is represented by the following mathematical expression.

[Math. 23]

$$\phi^z_s(x, y) = -\frac{3sxM_x}{4\pi\mu_0 \sqrt{x^2 + y^2 + s^2}^5} \quad (23)$$

Here, the following mathematical expression is established for arbitrary $y \in R$ according to symmetry of the mathematical expression (23).

[Math. 24]

$$\lim_{M \to \infty} \int_{-M}^{M} \phi_s^z(x, y) dx = 0 \qquad (24)$$

When the mathematical expression (23) is integrated on a straight line in the x-axis direction, the integrated values become 0 constantly irrespective of the y coordinate. Similarly, if the magnetic dipole direction M is $M=(M_x \cos \theta, M_y \sin \theta, 0)^T$, that is, if an angle formed by M and the x axis is $\theta$[rad], when a magnetic flux density distribution (magnetic field distribution) in the z direction in which a single magnetic dipole is generated is integrated on a straight line in a $\theta$ direction, the integrated values become 0 constantly irrespective of the position of the straight line. Accordingly, if a magnetic flux density distribution in the z-axis direction in magnetic dipoles is integrated on a straight line parallel to the magnetic dipole direction, the integrated values become 0 constantly irrespective of the position of the straight line.

Although the above is a principle established for all magnetic dipoles, the aforementioned principle is also established for superposition of arbitrary magnetic dipoles, that is, arbitrary material defect shape. This is because a magnetic flux density distribution in which a plurality of magnetic dipoles are generated can be obtained by summing up magnetic flux density distributions in which a single magnetic dipole is generated, that is, because integration of a magnetic flux density distribution in which a plurality of magnetic dipoles are generated on a straight line in the $\theta$ direction is equivalent to summation of results of integration of magnetic flux density distributions in which a single magnetic dipole is generated on a straight line in the $\theta$ direction for all magnetic dipoles. Accordingly, the property that a result of integration on a straight line parallel to a magnetization direction becomes 0 constantly is established for an arbitrary material defect.

As described above, when a magnetic field distribution in the z direction measured by the magnetic sensor array 21 has been integrated on a straight line in each direction, a direction in which the integrated values become 0 is a magnetization direction in the monitoring region 100. Accordingly, the magnetization direction computer 610 calculates a magnetization direction in the monitoring region 100 using only a magnetic field distribution in the z direction in magnetic field distributions measured by the magnetic sensor array 21.

(Method of Calculating Magnetization Direction)

Figure 10:
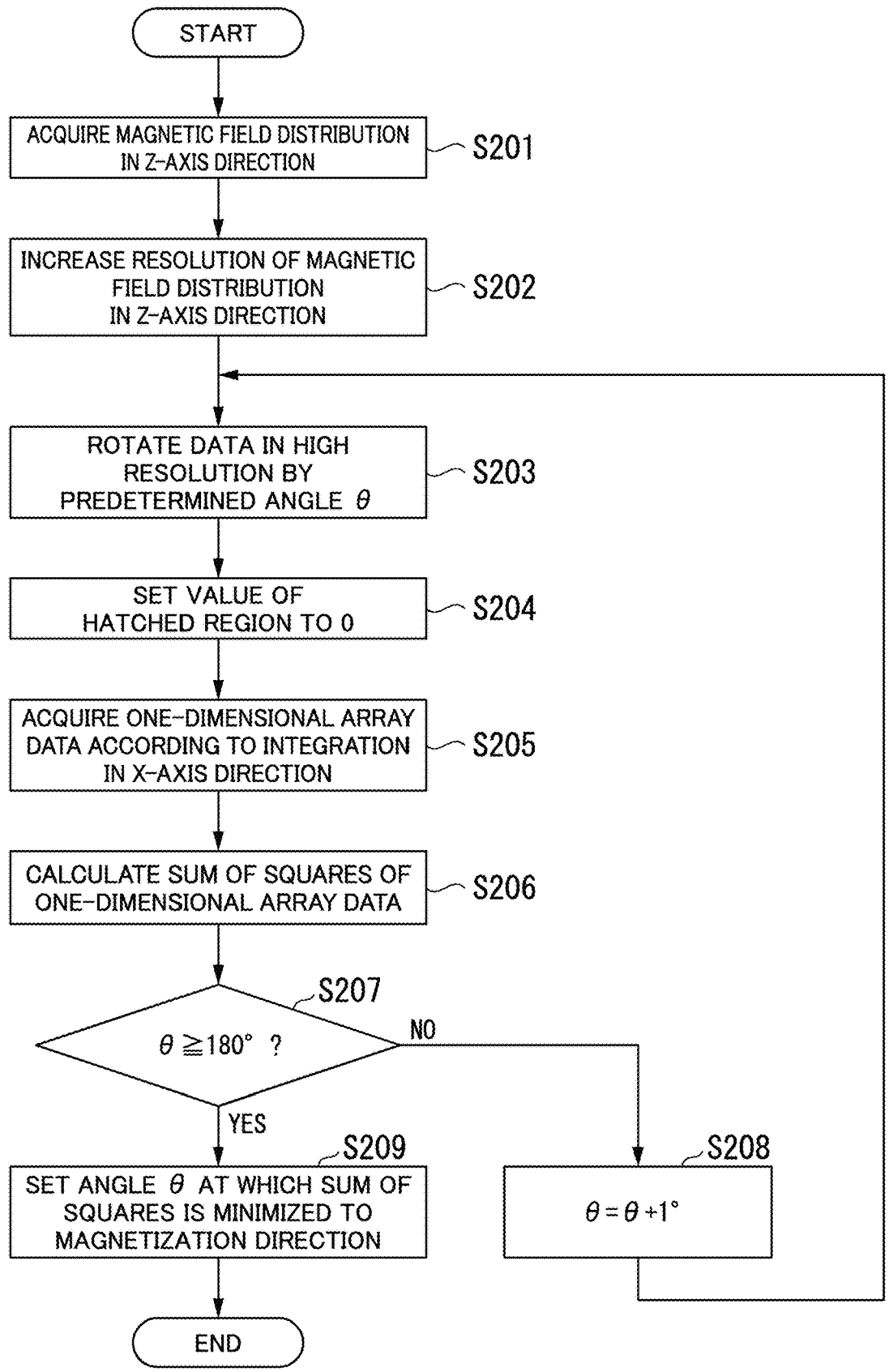
FIG. 10 is a diagram showing a flow of a method of calculating a magnetization direction in the measurement management device 5A according to one or more embodiments.
Figure 11:
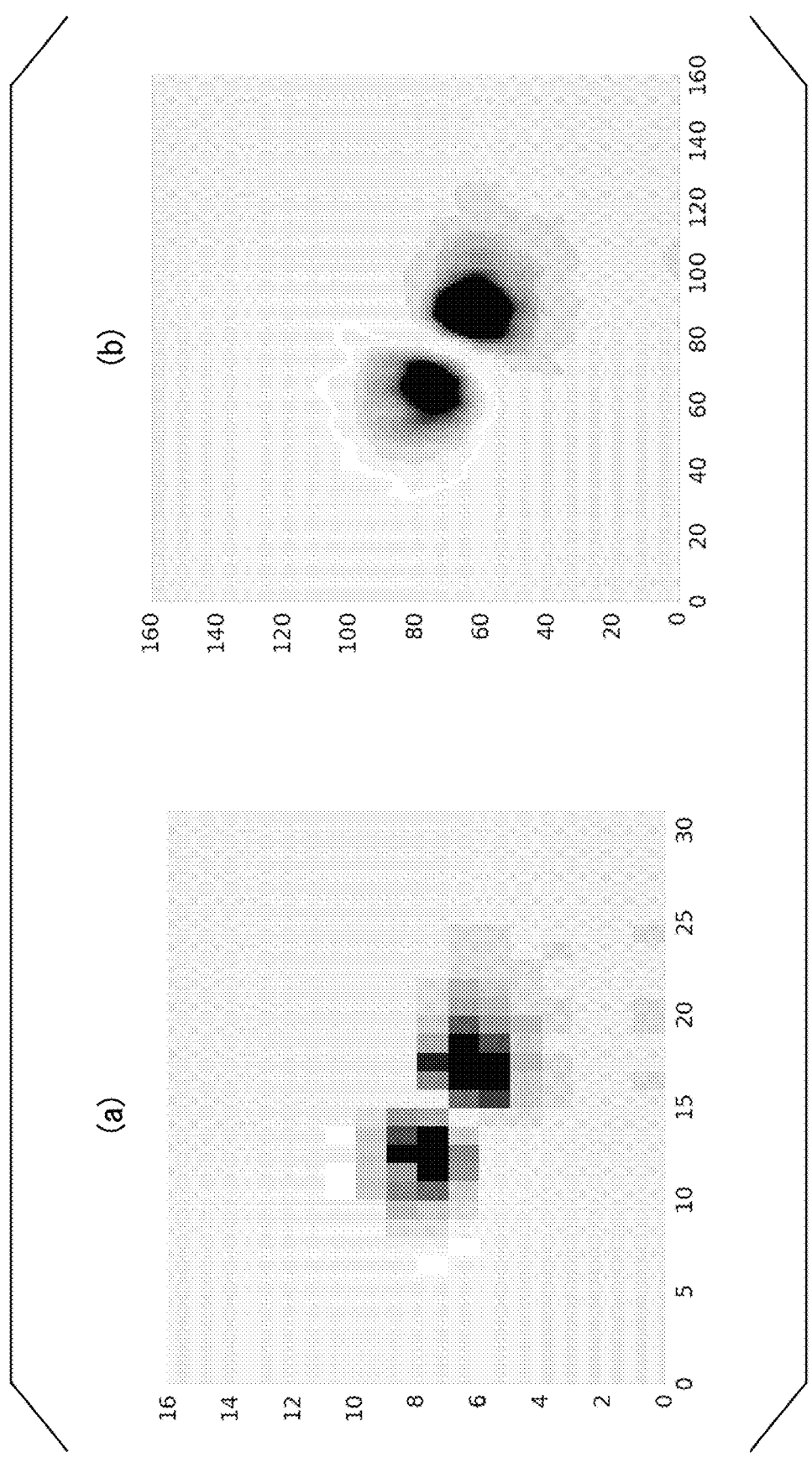
FIGS. 11(a) and 11(b) are diagrams showing a magnetic field distribution in the z direction in a monitoring region 100 according to one or more embodiments.

Hereinafter, a method of calculating a magnetization direction in the monitoring region 100 according to one or more embodiments using the drawings. FIG. 10 is a diagram showing a flow of a method of calculating a magnetization direction in the measurement management device 5A according to one or more embodiments. FIGS. 11(a) and 11(b) are diagrams showing a magnetic field distribution in the z direction in the monitoring region 100 according to one or more embodiments.

The magnetization direction computer 610 acquires a magnetic field distribution (FIG. 11(a)) in the monitoring region 100, stored in the magnetic field distribution storage 222, through the wireless communicator 51 (step S201). The magnetization direction computer 610 obtains a magnetic field distribution in a high resolution (FIG. 11(b)) by bicubic-interpolating the magnetic field distribution (FIG. 11(a)) acquired from the magnetic field distribution storage 222 (step S202). Meanwhile, a method of increasing the resolution of the magnetic field distribution acquired from the magnetic field distribution storage 222 is not limited to bicubic interpolation and various methods can be applied if they can increase the resolution in one or more embodiments.

Figure 12:
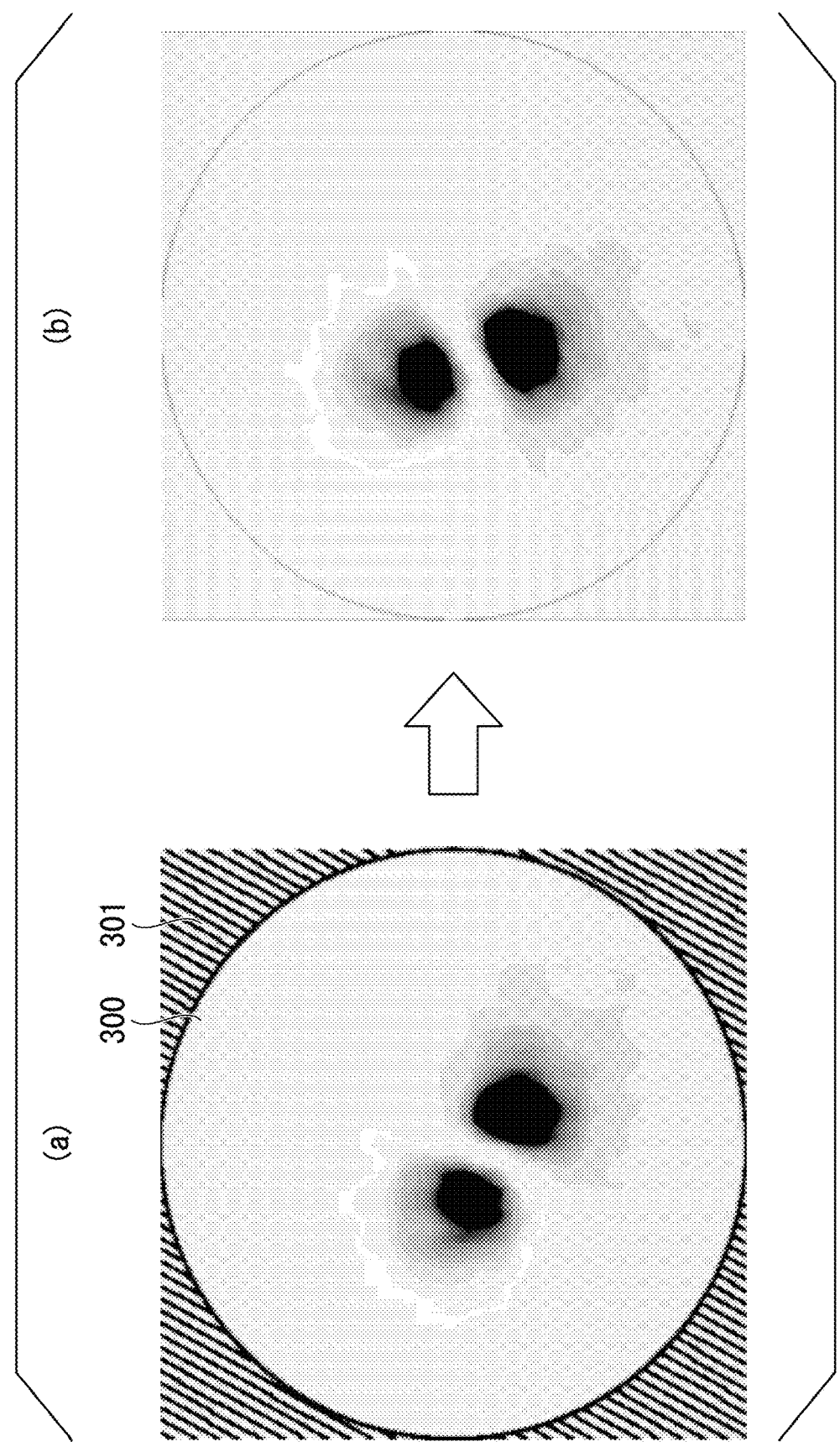
FIGS. 12(a) and 12(b) are diagrams showing magnetic field distribution data in a high resolution according to one or more embodiments.

The magnetization direction computer 610 rotates a region defined by a circle 300 in FIG. 12(a) by an angle $\theta$ in the data of the magnetic field distribution in a high resolution (step S203). Meanwhile, although an initial value of the angle $\theta$ is set to 1° as an example in one or more embodiments, the present invention is not limited thereto. In addition, although the rotated region is defined by the circle 300, the present invention is not limited to the circle and various shapes can be used.

In addition, the magnetization direction computer 610 sets all values of magnetic field distributions of a hatched region 301 other than the region defined by the circle 300 to 0 in the data of the magnetic field distribution in a high resolution (step S204). FIG. 12(b) is a diagram showing data obtained by rotating the data of the magnetic field distribution in a high resolution shown in FIG. 12(a) by an angle $\theta$ and setting the hatched region 301 other than the region defined by the circle 300 to 0. Meanwhile, FIG. 12(b) is a diagram showing data obtained by rotating the data of the magnetic field distribution in a high resolution shown in FIG. 12(a) by an angle $\theta$ of 45° and setting the hatched region 301 other than the region defined by the circle 300 to 0 for convenience description.

Figure 13:
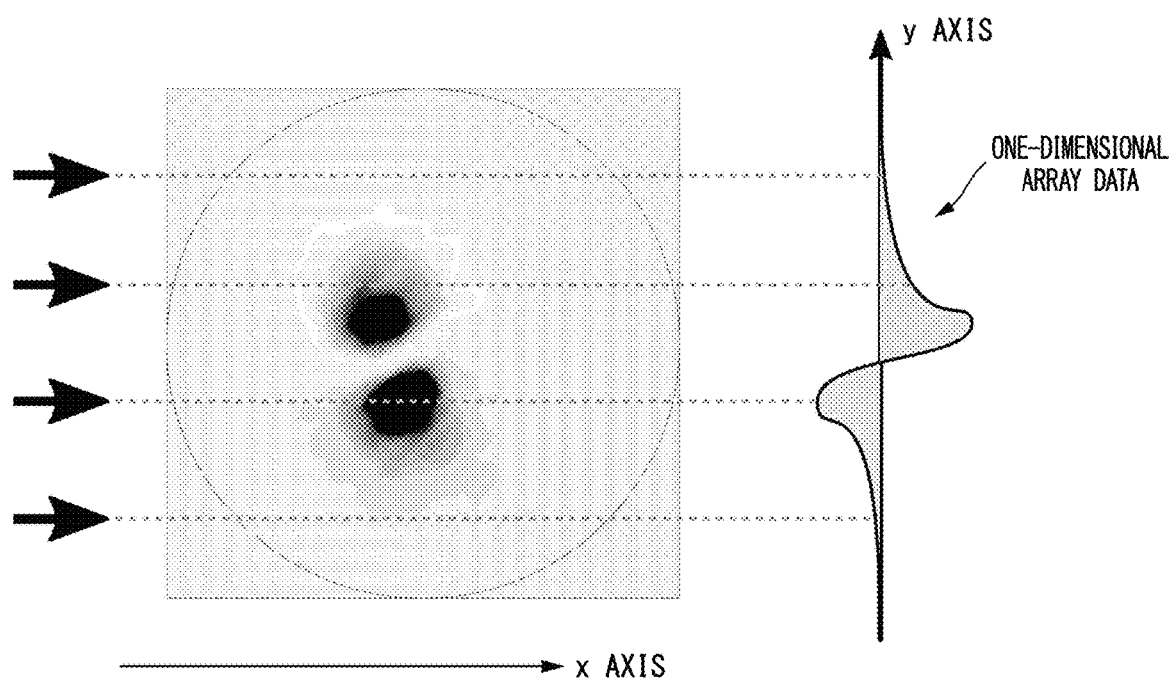
FIG. 13 is a diagram for describing a method of integrating a magnetic field distribution in a z-axis direction of a magnetization direction computer 610 according to one or more embodiments.

The magnetization direction computer 610 integrates the data of the magnetic field distribution shown in FIG. 12(b) in the x-axis direction. For example, at the position of a straight line on which integration in the x-axis direction is performed, the y-axis position of each straight line is a value for each predetermined interval. In this manner, the magnetization direction computer 610 integrates the data of the magnetic field distribution shown in FIG. 12(b) in the x-axis direction to acquire one-dimensional array data of the integrated values (step S205). In this manner, the magnetization direction computer 610 integrates the data of the magnetic field distribution shown in FIG. 12(b) in the x-axis direction along a plurality of straight lines having different y-axis direction values to acquire one-dimensional array data of integrated values obtained from integration in the x-axis direction with respect to a magnetic field distribution in the z-axis direction (FIG. 13).

The magnetization direction computer 610 calculates a sum of squares of the acquired one-dimensional array data (step S206). The magnetization direction computer 610 associates the calculated sum of squares with the angle $\theta$ and stores the associated value.

The magnetization direction computer 610 determines whether the angle $\theta$ is equal to or greater than 180° (step S207). When it is determined that the angle $\theta$ is not equal to or greater than 180°, the magnetization direction computer 610 adds 1° to the angle $\theta$ (step S208) and proceeds to the process of step S203. Further, although a process of adding 1° to the angle $\theta$ is performed in step S208 of one or more embodiments, the present invention is not limited thereto. For example, 2° may be added to the angle $\theta$ in step S208. That is, a value added to the angle $\theta$ can be set to any value.

Figure 14:
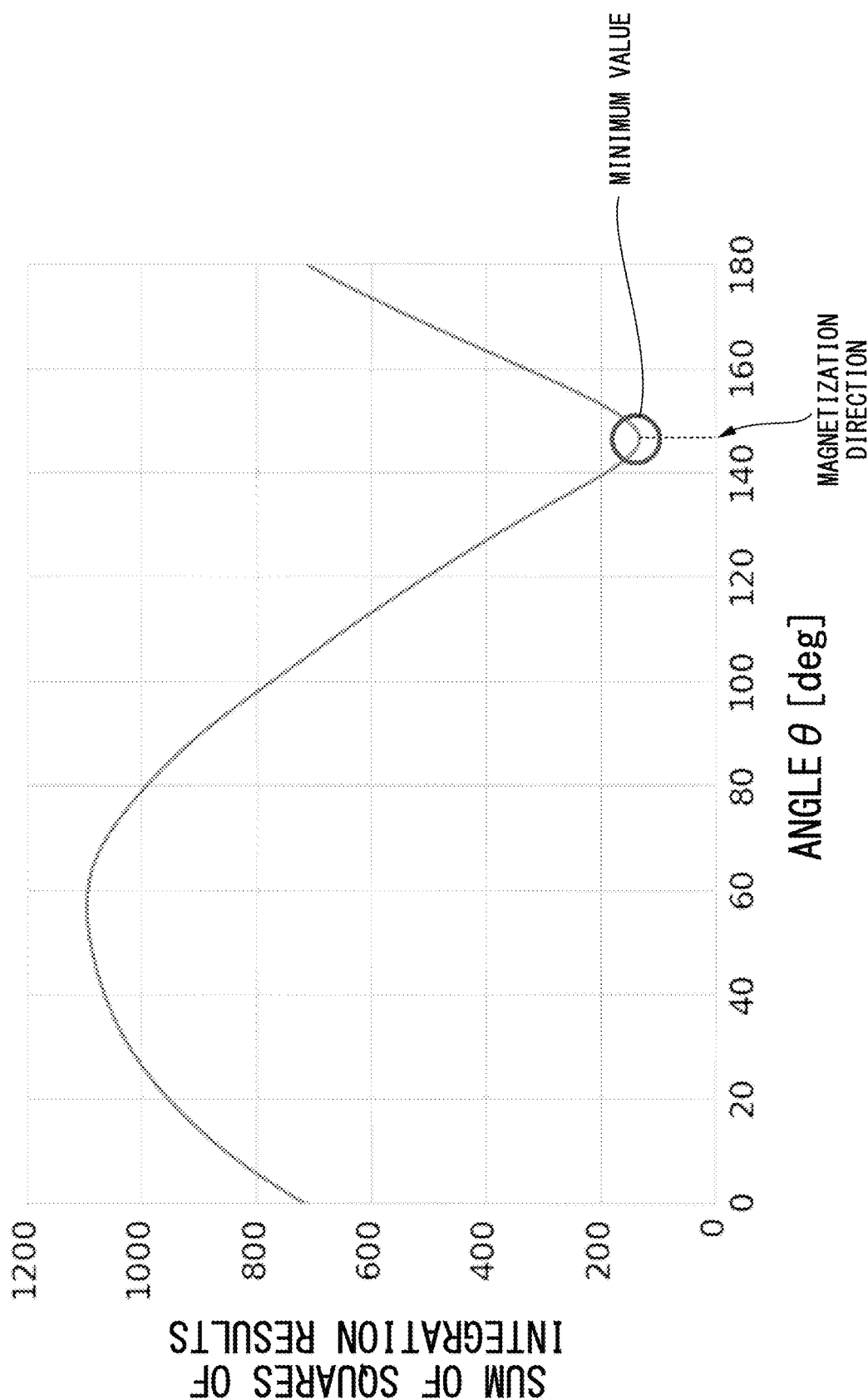
FIG. 14 is a graph of a sum of squares of one-dimensional array data calculated for each of angles θ (1°, 2°, . . . 180°) according to one or more embodiments.

In this manner, the magnetization direction computer 610 calculates a sum of squares of one-dimensional array data whenever the angle $\theta$ is rotated by 1°. That is, the magnetization direction computer 610 calculates a sum of squares of one-dimensional array data for each of angles $\theta=1°$, 2°, . . . 180°, associates the sum of squares with the angle $\theta$ and stores the associated value. FIG. 14 is a graph of one-dimensional array data calculated for each angle θ (1°, 2°, . . . 180°) according to one or more embodiments.

When it is determined that the angle θ is equal to or greater than 180°, the magnetization direction computer 610 sets an angle θ at which a sum of squares is minimized among sums of squares of one-dimensional array data for angles θ to a magnetization direction in the monitoring region 100 (step S209). Then, the magnetization direction computer 610 stores the determined magnetization direction in the monitoring region 100 in the magnetization direction storage 611.

As described above, the measurement management device 5A (material defect detection device) according to one or more embodiments calculates a density distribution of magnetic dipoles in the monitoring region 100 based on a magnetic field distribution measured by each magnetic sensor 212 (magnetic sensor array 21). In addition, the measurement management device 5A computes a magnetization direction in the monitoring region 100 based on a magnetic field distribution measured by each magnetic sensor 212. Then, the measurement management device 5A calculates a depth distribution of material defect in the monitoring region 100 based on the calculated density distribution of magnetic dipoles and magnetization direction. Accordingly, the measurement management device 5 can easily estimate shape information of a material defect in the monitoring region 100 of metallic equipment without using pattern matching.

In addition, the magnetization direction computer 610 of the above-described measurement management device 5A integrates a magnetic field distribution in a normal direction on a straight line in each of perpendicular directions with respect to the normal direction and computes a magnetization direction based on the integrated values obtained from integration on the straight line.

For example, the magnetization direction computer 610 integrates a magnetic field distribution in a normal direction on each of a plurality of straight lines in which perpendicular directions with respect to the normal direction are different to acquire one-dimensional array data of the integrated values in each perpendicular direction. Then, the magnetization direction computer 610 determines a direction of one-dimensional array data having a minimum sum of squares among one-dimensional array data in the respective perpendicular directions as a magnetization direction in the monitoring region 100.

Further, the magnetic dipole density distribution calculator 52A may or may not include the magnetization direction computer 610. That is, it is desirable that the measurement management device 5A have a function of computing a magnetization direction in the monitoring region 100, a function of calculating a density distribution of magnetic dipoles in the monitoring region 100 which is a predetermined region based on a magnetic field distribution measured by the magnetic sensor array 21 and a computed magnetization direction, and a function of calculating a depth distribution of material defect in the monitoring region 100 based on the density distribution of magnetic dipoles.

The measurement management devices 5 and 5A according to the above-described embodiments may be realized by a computer. In such a case, the measurement management devices 5 and 5A may be realized by recording a program for realizing this function in a computer readable recoding medium and causing a computer system is caused to read and execute the program recorded in the recording medium. Meanwhile, the "computer system" mentioned here includes an OS and hardware such as peripheral devices. In addition, the "computer readable recording medium" refers to a portable medium such as a flexible disk, a magneto-optic disk, a ROM or a CD-ROM, or a storage device such as a hard disk embedded in a computer system. Further, the "computer readable recording medium" may also include a medium which dynamically saves a program for a short time, such as a communication line when the program is transmitted through a network such as the Internet or a communication circuit such as a telephone circuit, and a medium which saves a program for a specific time, such as a volatile memory in a computer system that is a server or a client in that case. In addition, the aforementioned program may be a program for realizing some of the above-described functions, a program capable of realizing the above-described functions by combining the functions with a program which has already been recorded in a computer system, or a program realized using a programmable logic device such as a field programmable gate array (FPGA).

Furthermore, a computer may comprise a processor including a CPU, various memories such as a ROM, a RAM and an EEPROM (registered trademark), a communication bus and an interface and function as the measurement management device 5 by reading and sequentially executing a processing program stored in the ROM as firmware through the CPU.

Although the disclosure has been described with respect to only a limited number of embodiments, those skill in the art, having benefit of this disclosure, will appreciate that various other embodiments may be devised without departing from the scope of the present invention. Accordingly, the scope of the invention should be limited only by the attached claims.

It should be noted that execution order of each process of operations, procedures, steps and the like in devices, systems, programs and methods in the claims, specification and drawings may be realized as an arbitrary order unless it is especially clarified as "prior to," "in advance" and the like and an output of a previous process is used in the following process. Even when operation flows in the claims, specification and drawings have been described using "first," "subsequently" and the like for convenience, it does not mean that the operation flows need to be performed in this order.

INDUSTRIAL APPLICABILITY

The present invention can be widely applied to a material defect detection device, a material defect detection system, a material defect detection method and a program to allow shape information of a material defect to be easily estimated.

REFERENCE SIGNS LIST

1 Material defect detection device system
2 Magnetic field measurement device
3 Communication network
4 Wireless sensor network gateway
5 Measurement management device (material defect detection device)
21 Magnetic sensor array
22 Magnetic field measurer
23, 51 Wireless communicator
52 Magnetic dipole density distribution calculator
53 Depth distribution calculator
221 Magnetic field distribution acquirer
222 Magnetic field distribution storage
521 Magnetic dipole density distribution computer 522 Magnetic dipole density distribution computation parameter storage
523 Magnetic dipole density distribution storage
531 Depth distribution computer
532 Depth distribution computation parameter storage
533 Depth distribution storage

The invention claimed is:

1. A material defect detection device that detects a material defect in a predetermined region of metallic equipment using a magnetic field distribution in the predetermined region measured by a magnetic sensor array including a plurality of magnetic sensors, the material defect detection device comprising:
a processor that:
calculates a density distribution of magnetic dipoles in the predetermined region based on the magnetic field distribution; and
calculates a depth distribution of material defect in the predetermined region based on the density distribution of the magnetic dipoles, wherein
the processor further:
stores, in a storage coupled to the processor, a magnetization quantity in the predetermined region; and
calculates the density distribution of magnetic dipoles in the predetermined region based on the magnetic field distribution and an estimation value of a magnetic flux density at a position of each of the magnetic sensors calculated from the magnetization quantity.

2. The material defect detection device according to claim 1,
wherein the processor further calculates the depth distribution of material defect in the predetermined region based on the density distribution of the magnetic dipoles and a coefficient based on the magnetization quantity.

3. The material defect detection device according to claim 1,
wherein the processor further calculates the density distribution of the magnetic dipoles by solving an optimization problem to minimize a difference between the magnetic field distribution and the estimation value under a constraint condition where the density distribution of the magnetic dipoles is a positive value.

4. The material defect detection device according to claim 3,
wherein the processor further solves the optimization problem as a quadratic programming problem by spatially discretizing the density distribution of the magnetic dipoles.

5. The material defect detection device according to claim 3,
wherein the processor further:
calculates the density distribution of magnetic dipoles in each of three-dimensional directions of a longitudinal direction of the predetermined region and a direction orthogonal to the longitudinal direction, and
sets a value obtained by averaging the calculated density distributions of magnetic dipoles in the three-dimensional directions to the density distribution of magnetic dipoles in the predetermined region.

6. The material defect detection device according to claim 3,
wherein the processor further:
adds a regularization term to the optimization problem, and
solves the optimization problem with the regularization term added to the optimization problem.

7. The material defect detection device according to claim 4,
wherein the processor further:
dimensionally reduces the optimization problem according to principal component analysis, and
solves the dimensionally reduced optimization problem.

8. The material defect detection device according to claim 1,
wherein the processor further:
computes a magnetization direction in the predetermined region of the metallic equipment based on the magnetic field distribution; and
calculates the density distribution of magnetic dipoles in the predetermined region based on the magnetic field distribution and the magnetization direction.

9. The material defect detection device according to claim 8,
wherein the processor further:
integrates a magnetic field distribution in a normal direction of the predetermined region among magnetic field distributions measured by the magnetic sensor array on a straight line in each of perpendicular directions with respect to the normal direction, and
computes the magnetization direction based on integrated values obtained from integration on the straight line.

10. A material defect detection system comprising:
the material defect detection device according to claim 1; and
the magnetic sensor array.

11. A material defect detection device that detects a material defect in a predetermined region of metallic equipment using a magnetic field distribution in the predetermined region measured by a magnetic sensor array including a plurality of magnetic sensors, the material defect detection device comprising:
a processor that:
calculates a density distribution of magnetic dipoles in the predetermined region based on the magnetic field distribution;
calculates a depth distribution of material defect in the predetermined region based on the density distribution of the magnetic dipoles;
computes a magnetization direction in the predetermined region of the metallic equipment based on the magnetic field distribution;
calculates the density distribution of magnetic dipoles in the predetermined region based on the magnetic field distribution and the magnetization direction;
integrates a magnetic field distribution in a normal direction of the predetermined region among magnetic field distributions measured by the magnetic sensor array on a straight line in each of perpendicular directions with respect to the normal direction;
computes the magnetization direction based on integrated values obtained from integration on the straight line;
integrates the magnetic field distribution in the normal direction on each of a plurality of different straight lines parallel to the perpendicular directions in each of the perpendicular directions to acquire one-dimensional array data of the integrated values; and determines a direction of the array data where a sum of squares of the array data is minimized among the array data in each of the perpendicular directions as the magnetization direction.

12. The material defect detection system according to claim 10,
wherein a distance between the position of each of the magnetic sensors and the surface of the predetermined region in a normal direction of the surface is constant.

* * * * *